(12) United States Patent
Huang

(10) Patent No.: US 10,998,404 B2
(45) Date of Patent: May 4, 2021

(54) HIGH VOLTAGE DEVICE AND MANUFACTURING METHOD THEREOF

(71) Applicant: RICHTEK TECHNOLOGY CORPORATION, Zhubei (TW)

(72) Inventor: Tsung-Yi Huang, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 12 days.

(21) Appl. No.: 16/503,509

(22) Filed: Jul. 4, 2019

(65) Prior Publication Data

US 2020/0052072 A1  Feb. 13, 2020

(30) Foreign Application Priority Data

Aug. 8, 2018 (TW) ................................. 107127582

(51) Int. Cl.

| H01L 29/06 | (2006.01) |
|---|---|
| H01L 29/10 | (2006.01) |
| H01L 29/66 | (2006.01) |
| H01L 21/265 | (2006.01) |
| H01L 21/324 | (2006.01) |
| H01L 21/225 | (2006.01) |

(Continued)

(52) U.S. Cl.
CPC ...... *H01L 29/1083* (2013.01); *H01L 21/2253* (2013.01); *H01L 21/26513* (2013.01); *H01L 21/324* (2013.01); *H01L 21/743* (2013.01); *H01L 29/0653* (2013.01); *H01L 29/1087* (2013.01); *H01L 29/1095* (2013.01); *H01L 29/66681* (2013.01); *H01L 29/7816* (2013.01)

(58) Field of Classification Search
CPC ............. H01L 29/1083; H01L 29/0653; H01L 29/1095; H01L 29/1087; H01L 29/66681; H01L 21/26513; H01L 21/324; H01L 21/2253; H01L 21/743; H01L 29/7816; H01L 29/0878; H01L 29/66689; H01L 29/0692; H01L 29/36; H01L 21/761; H01L 29/42368; H01L 29/66; H01L 29/78; H01L 29/0696; H01L 29/7812; H01L 29/7824; H01L 27/02; H01L 27/06; H01L 29/10; H01L 27/0262; H01L 29/7835; H01L 27/0259; H01L 29/6681; H01L 29/66659; H01L 27/07; H01L 29/06; H01L 29/08; H01L 21/08; H01L 21/07

See application file for complete search history.

(56) References Cited

U.S. PATENT DOCUMENTS

| 6,049,118 A * | 4/2000 | Nagano ............... H01L 27/1443 257/187 |
|---|---|---|
| 7,960,222 B1 * | 6/2011 | Kwon ................. H01L 27/0921 438/197 |

(Continued)

*Primary Examiner* — Cuong B Nguyen
*Assistant Examiner* — Samuel Park
(74) *Attorney, Agent, or Firm* — Tung & Associates

(57) ABSTRACT

A high voltage device includes: a semiconductor layer, an isolation structure, a first deep well, a second deep well, a drift well, a first well, a second well, a body region, a body contact, a high voltage well, a gate, and a source and a drain. The high voltage well is formed in the second deep well, and the high voltage well is not in contact with any of the first deep well, the first well, and the second well, wherein at least part of the high voltage well is located right below all of a drift region to suppress a latch-up current generated in the high voltage device.

10 Claims, 14 Drawing Sheets

(51) Int. Cl.
*H01L 21/74* (2006.01)
*H01L 29/78* (2006.01)

(56) References Cited

U.S. PATENT DOCUMENTS

| | | | | |
|---|---|---|---|---|
| 8,575,693 B1* | 11/2013 | Huang | ............... | H01L 29/66681 257/337 |
| 2009/0206376 A1* | 8/2009 | Mita | ................... | H01L 29/8618 257/288 |
| 2011/0303977 A1* | 12/2011 | Huang | ................ | H01L 29/0847 257/339 |
| 2013/0328103 A1* | 12/2013 | Salcedo | .............. | H01L 27/0262 257/121 |
| 2014/0225228 A1* | 8/2014 | Salcedo | ................ | H01L 27/067 257/575 |
| 2014/0339601 A1* | 11/2014 | Salcedo | .............. | H01L 29/7436 257/140 |
| 2015/0069509 A1* | 3/2015 | Lee | .................... | H01L 29/1083 257/343 |
| 2017/0110575 A1* | 4/2017 | Huang | ................ | H01L 29/0878 |

* cited by examiner

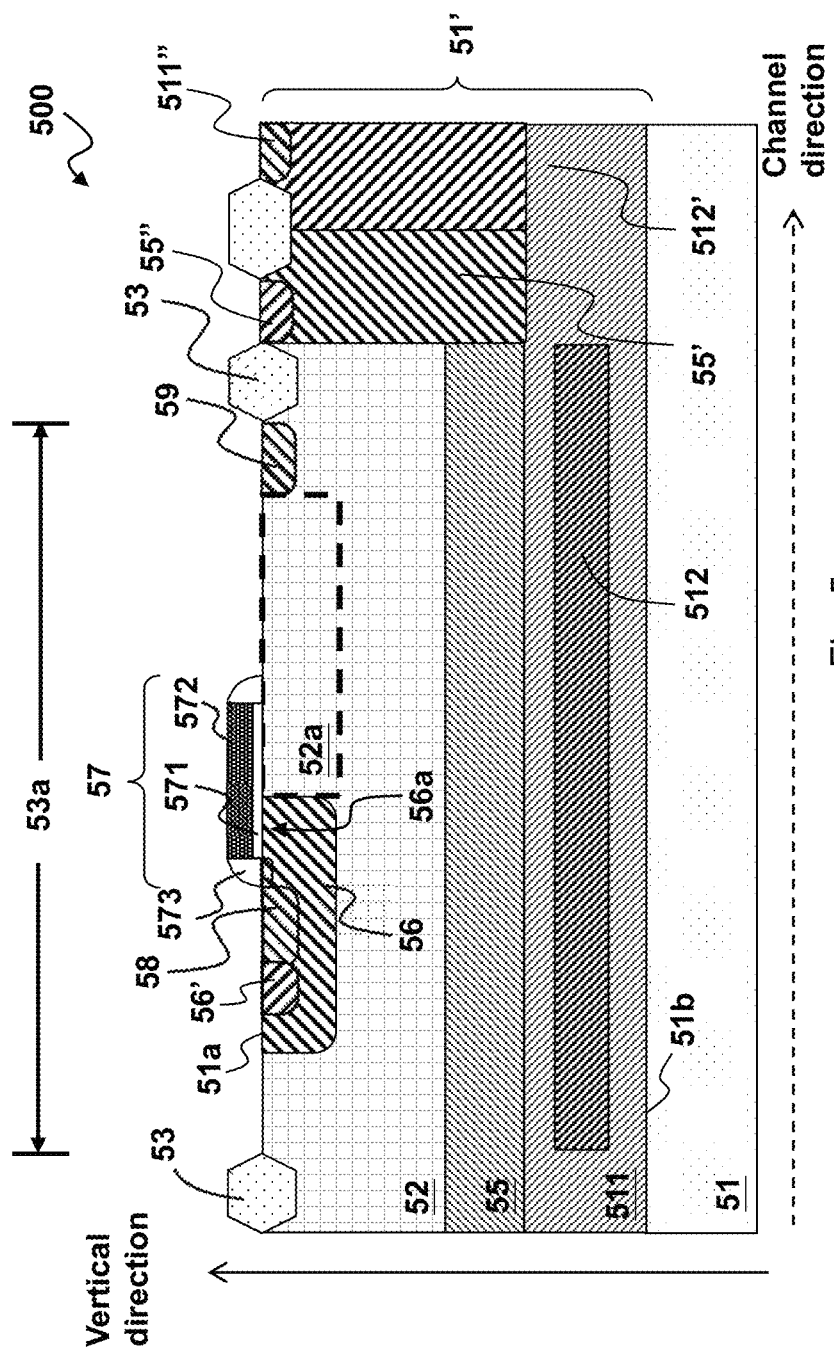

HIGH VOLTAGE DEVICE AND MANUFACTURING METHOD THEREOF

CROSS REFERENCES

The present invention claims priority to TW 107127582 filed on Aug. 8, 2018.

BACKGROUND OF THE INVENTION

Field of Invention

The present invention relates to a high voltage device and a manufacturing method thereof; particularly, it relates to such high voltage device which can avoid latch-up of a parasitic transistor therein, and manufacturing method thereof.

Description of Related Art

FIGS. 1A and 1B show schematic diagrams of a cross-section view and a top-view of a prior art high voltage device 100, respectively. In the context of the present invention, a "high voltage" device refers a device which needs to withstand a voltage over 5V on a drain thereof in normal operation. Typically, the high voltage device 100 has a drift region 12a (as indicated by the dashed frame shown in FIG. 1B) which separates the drain 19 and the body region 16 of the high voltage device 100, wherein a lateral length of the drift region 12a is determined according to the threshold voltage that the high voltage device 100 is designed to operate by.

As shown in FIGS. 1A and 1B, the high voltage device 100 includes: a well 12, an isolation region 13, a drift oxide region 14, a body region 16, a body contact 16', a gate 17, a source 18, and a drain 19. The well 12 has a conductivity type of N-type, and is formed on a substrate 11. The isolation region 13 is a local oxidation of silicon (LOCOS) structure, for defining a device region 13a which is an active area for an operation of the high voltage device 100. The device region 13a has a range which is indicated by the bold dashed frame in FIG. 1A. The gate 17 overlays a part of the drift oxidation region 14.

When the high voltage device 100 is used as a low-side device, latch-up may occur in a parasitic transistor in the high voltage device 100 to generate a latch-up current, which can cause malfunction of the high voltage device 100.

In view of above, to overcome the drawback in the prior art, the present invention provides a high voltage device which can avoid latch-up of a parasitic transistor therein to increase a safe operation area (SOA) of the high voltage device, and a manufacturing method thereof. The definition of SOA is well known by those skilled in the art, so it is not redundantly explained here.

SUMMARY OF THE INVENTION

From one perspective, the present invention provides a high voltage device comprising: a semiconductor layer, which is formed on a substrate, and has a top surface and a bottom surface opposite to the top surface in a vertical direction, wherein the substrate has a first conductivity type; an isolation region, which is formed on and in contact with the top surface, wherein the isolation region is for defining a device region; a first deep well having the first conductivity type, which is formed in the semiconductor layer; a second deep well having a second conductivity type, which is formed below and in contact with the first deep well in the semiconductor layer, the second deep well encompassing a lower boundary of the first deep well; a drift well having the second conductivity type, which is formed on and in contact with the first deep well in the semiconductor layer, and overlays an upper boundary of the first deep well, wherein the draft well is below and in contact with the top surface in the vertical direction; a first well having the first conductivity type, which is formed on the second deep well outside the device region, and is located below the top surface and in contact with the top surface in the vertical direction, wherein the first well is in contact with the first deep well and electrically connected to the first deep well; a second well having the second conductivity type, which is formed on the second deep well outside the device region and outside the first well, and is located below the top surface and in contact with the top surface in the vertical direction, wherein the second well is in contact with and electrically connected to the second deep well; a body region having the first conductivity type, which is formed on the second deep well in the drift well within the device region, and is located below the top surface and in contact with the top surface in the vertical direction; a body contact having the first conductivity type, which is formed in the body region, and is located below the top surface and in contact with the top surface in the vertical direction, wherein the body contact serves as an electrical contact of the body region; a high voltage well having the second conductivity type, which is formed in the second deep well, wherein the high voltage well is not in contact with any of the first deep well, the first well, and the second well; a gate, which is formed on the top surface within the device region, wherein part of the first high voltage well is located below and in contact with the gate in the vertical direction, the gate including: a dielectric layer, which is formed on and in contact with the top surface, and is in contact with the first high voltage well in the vertical direction; a conductive layer, which is formed on and in contact with the dielectric layer, and serves as an electrical contact of the gate; and a spacer layer, which is formed outside of two sidewalls of the conductive layer, and serves as an electrical insulation layer of the gate; and a source and a drain which have the second conductivity type and are formed below and in contact with the top surface in the vertical direction within the device region, wherein the source and the drain are located below and outside two sides of the gate respectively, wherein the side of the gate which is closer to the source is a source side and the side of the gate which is closer to the drain is a drain side, and wherein the source is located in the body region, and the drain is located in the drift well outside the drain side; wherein an inversion region is formed in the body region between the source and the first high voltage well in a channel direction to serve as an inversion current channel in an ON operation of the high voltage device; wherein a drift region is located in the drift well between the drain and the body region in the channel direction, is in contact with the top surface, to serve as a drift current channel in the ON operation of the high voltage device; and wherein at least part of the high voltage well is located right below all of the drift region.

From another perspective, the present invention provides a manufacturing method of a high voltage device, comprising: forming a semiconductor layer on a substrate, semiconductor layer having a top surface and a bottom surface opposite to the top surface in a vertical direction, wherein the substrate has a first conductivity type; forming an isolation region on the top surface for defining a device region, wherein the isolation region is in contact with the top surface; forming a first deep well having the first conductivity type in the semiconductor layer; forming a second deep well having a second conductivity type below and in contact with the first deep well in the semiconductor layer, the second deep well encompassing a lower boundary of the first deep well; forming a drift well having the second conductivity type on and in contact with the first deep well in the semiconductor layer, wherein the draft well overlays an upper boundary of the first deep well, and the draft well is below and in contact with the top surface in the vertical direction; forming a first well having the first conductivity type on the second deep well outside the device region, wherein the first well is located below the top surface and in contact with the top surface in the vertical direction, and is in contact with the first deep well and electrically connected to the first deep well; forming a second well having the second conductivity type on the second deep well outside the device region and outside the first well, wherein the second well is located below the top surface and in contact with the top surface in the vertical direction, and is in contact with and electrically connected to the second deep well; forming a body region having the first conductivity type on the second deep well in the drift well within the device region, wherein the body region is located below the top surface and in contact with the top surface in the vertical direction; forming a body contact having the first conductivity type in the body region, wherein the body contact is located below the top surface and in contact with the top surface in the vertical direction, and the body contact serves as an electrical contact of the body region; forming a high voltage well having the second conductivity type in the second deep well, wherein the high voltage well is not in contact with any of the first deep well, the first well, and the second well; forming a gate on the top surface within the device region, wherein part of the drift well is located right below and in contact with the gate in the vertical direction, the gate including: a dielectric layer, which is formed on and in contact with the top surface, and is in contact with the first high voltage well in the vertical direction; a conductive layer, which is formed on and in contact with the dielectric layer, and serves as an electrical contact of the gate; and a spacer layer, which is formed outside of two sidewalls of the conductive layer, and serves as an electrical insulation layer of the gate; and forming a source and a drain having the second conductivity type below and in contact with the top surface in the vertical direction within the device region, wherein the source and the drain are located below and outside two sides of the gate respectively, wherein the side of the gate which is closer to the source is a source side and the side of the gate which is closer to the drain is a drain side, and wherein the source is located in the body region, and the drain is located in the drift well outside the drain side; wherein an inversion region is formed in the body region between the source and the first high voltage well in a channel direction to serve as an inversion current channel in an ON operation of the high voltage device; wherein a drift region is located in the drift well between the drain and the body region in the channel direction, is in contact with the top surface, to serve as a drift current channel in the ON operation of the high voltage device; and wherein at least part of the high voltage well is located right below all of the drift region.

In one preferable embodiment, the high voltage device further comprises a drift oxide region, which is formed on and in contact with the top surface, and is on and in contact with the drift region within the device region, wherein the drift oxide region includes a local oxidation of silicon (LOCOS) structure, a shallow trench isolation (STI) structure, or a chemical vapor deposition (CVD) oxide structure.

In one preferable embodiment, a concentration of the second conductivity type impurities of the high voltage well is higher than a concentration of the second conductivity type impurities of the second deep well.

In one preferable embodiment, the first deep well, the second deep well, and the substrate form a parasitic transistor, and the high voltage well suppresses a latch-up current generated by the parasitic transistor.

In one preferable embodiment, the high voltage device further includes: further comprising: a first conductivity type contact having the first conductivity type, which is formed in the first well, below the top surface and in contact with the top surface in the vertical direction, to serve as an electrical contact of the first well; and a second conductivity type contact having the second conductivity type, which is formed in the second well, below the top surface and in contact with the top surface in the vertical direction, to serve as an electrical contact of the second well.

The objectives, technical details, features, and effects of the present invention will be better understood with regard to the detailed description of the embodiments below.

BRIEF DESCRIPTION OF THE DRAWINGS

FIG. 5 shows a fourth embodiment of the present invention.

DESCRIPTION OF THE PREFERABLE EMBODIMENTS

The drawings as referred to throughout the description of the present invention are for illustration only, to show the interrelations among the process steps and the layers, while the shapes, thicknesses, and widths are not drawn in actual scale.

Figure 1A:
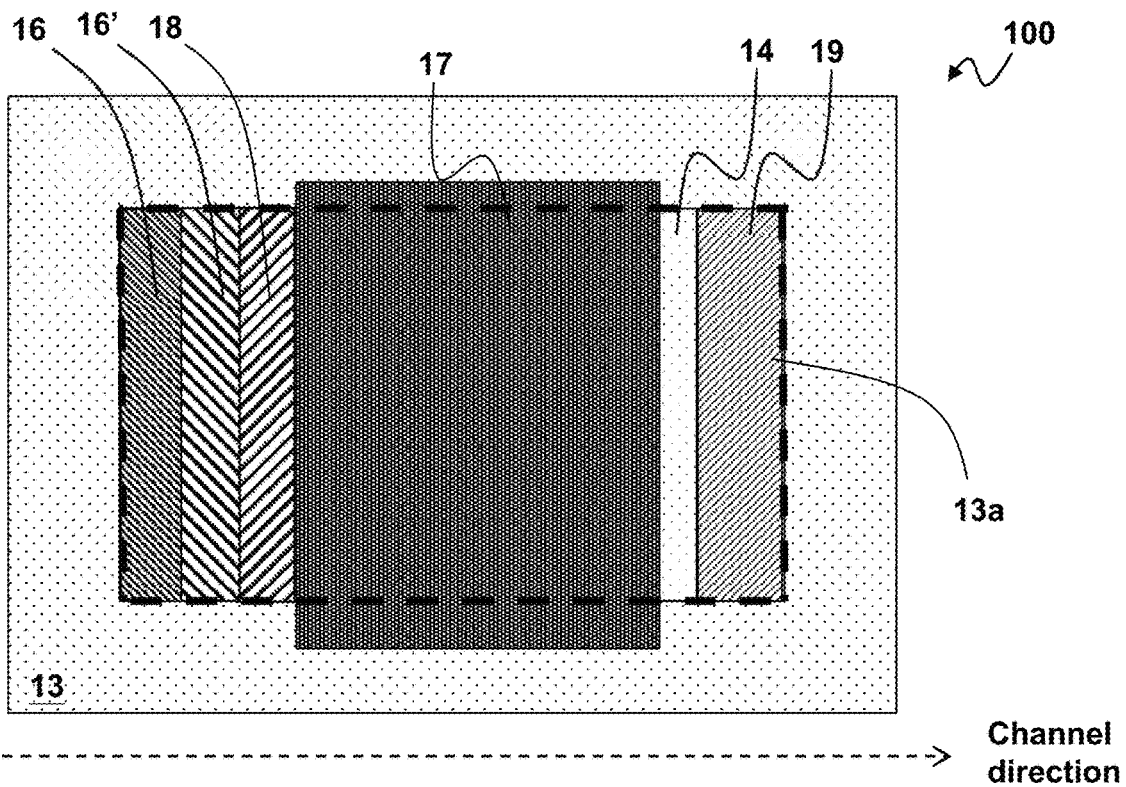
FIGS. 1A and 1B show a top view and a cross-section view of a conventional high voltage device 100, respectively.
Figure 1B:
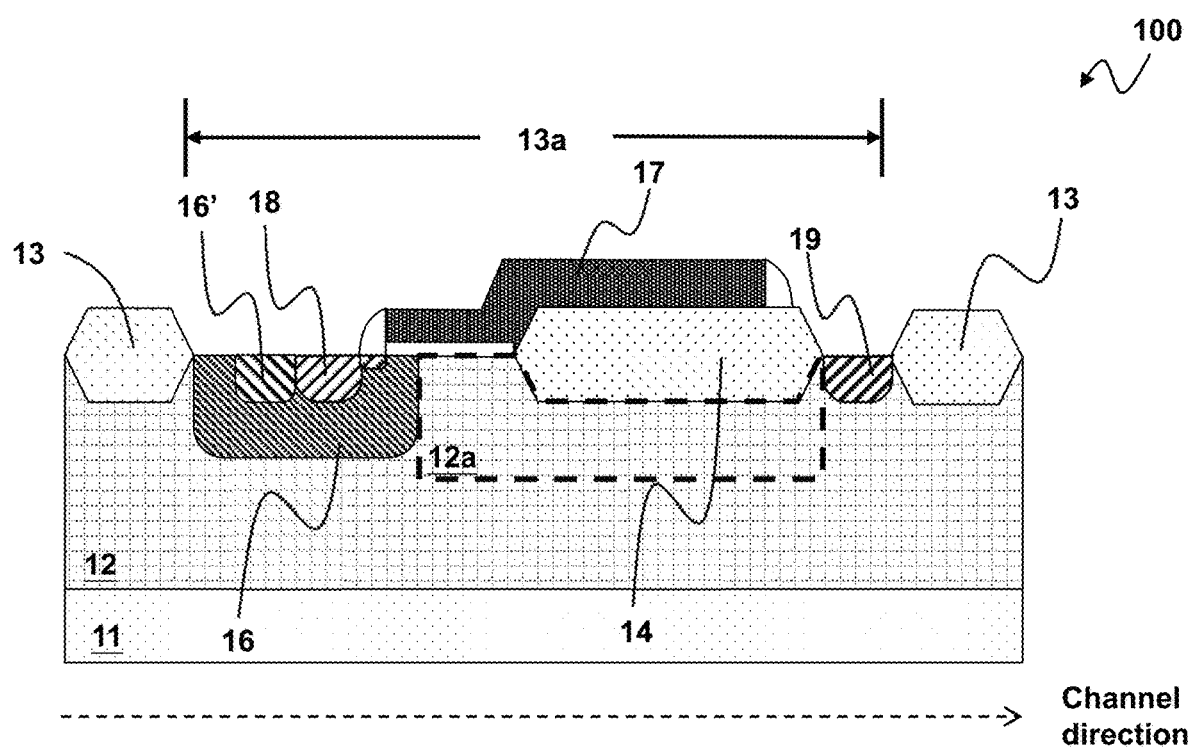
Figure 2:
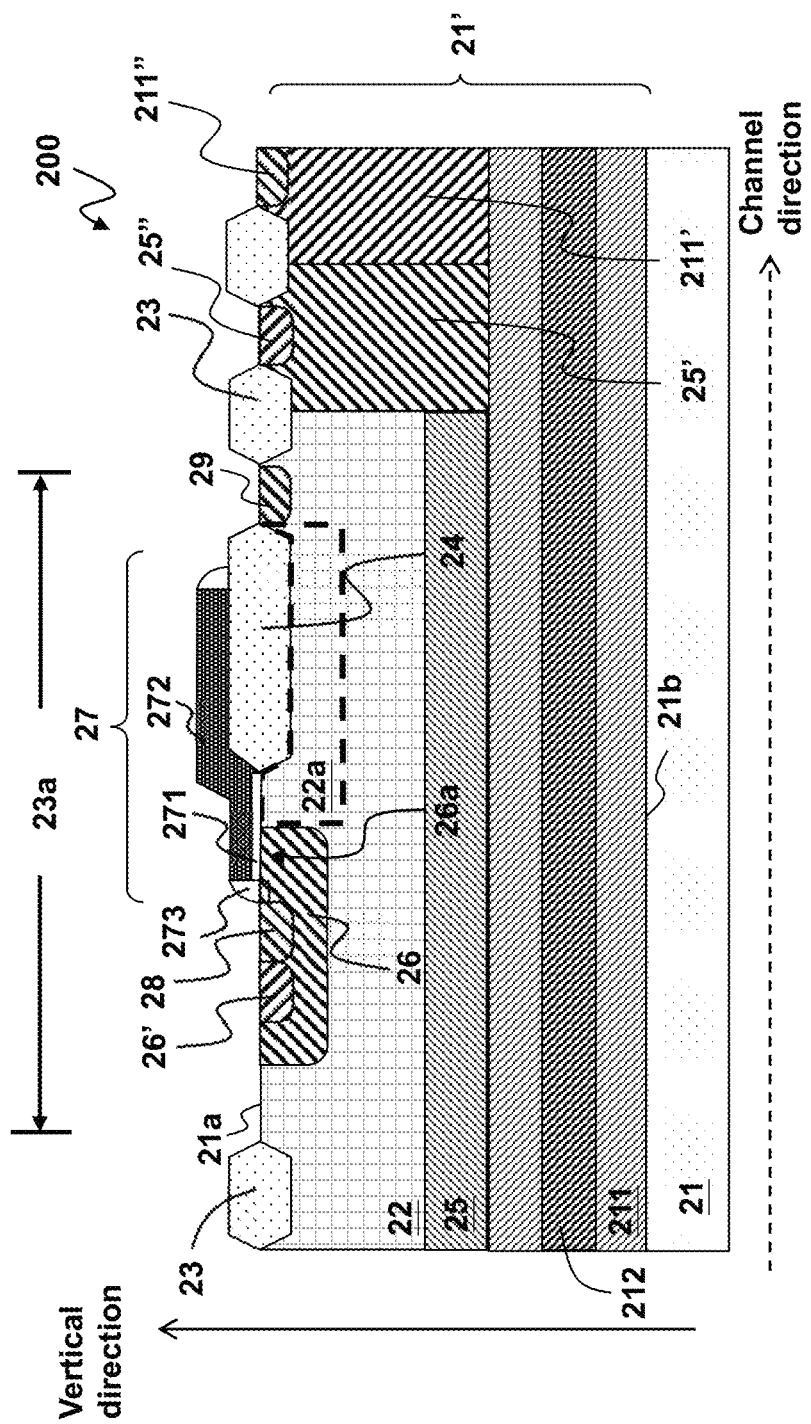
FIG. 2 shows a first embodiment of the present invention.

Please refer to FIG. 2 which shows a first embodiment of the present invention. FIG. 2 shows a schematic diagram of a cross-section view of a high voltage device 200. As shown in FIG. 2, the high voltage device 200 includes a semiconductor layer 21', a first deep well 25, a second deep well 211, a drift well 22, an isolation structure 23, a drift oxide region 24, a high voltage well 212, a body region 26, a body contact 26', a gate 27, a source 28, a drain 29, a first well 25', a first conductivity type contact 25", a second well 211', and a second conductivity type contact 211".

The semiconductor layer 21' is formed on the substrate 21, and the semiconductor layer 21' has a top surface 21a and a bottom surface 21b that is opposite to the top surface 21a in the vertical direction (as indicated by the direction of the solid arrow in FIG. 2). The substrate 21 is, for example but not limited to, a first conductivity type silicon substrate. The semiconductor layer 21', for example, is formed on the substrate 21 by an epitaxial growth process step, or, a part of the substrate 21 is used as the semiconductor layer 21'. The semiconductor layer 21' can be formed by any method known to a person having ordinary skill in the art, so the details thereof are not redundantly explained here.

Still referring to FIG. 2, the isolation structure 23 is formed on the top surface 21a and in contact with the top surface 21a, for defining an device region 23a. The isolation structure 23 is not limited to the local oxidation of silicon (LOCOS) structure as shown in the figure; for example, it may be a shallow trench isolation (STI) structure instead. The device region 23a is an active region of the operation of the high voltage device 200. The drift oxide region 24 is formed on the top surface 21a and in contact with the top surface 21a, and the drift oxide region 24 is located on the drift region 22a (as indicated by the dashed frame shown in FIG. 2) within the device region 23a, and is in contact with the drift region 22a.

The first deep well 25 having a first conductivity type is formed in the semiconductor layer 21'. The first deep well 25 can be formed by, for example but not limited to, an ion implantation process step which implants first conductivity type impurities in the semiconductor layer 21' in the form of accelerated ions, to form the first deep well 25. The second deep well 211 having a second conductivity type is formed below and in contact with the first deep well 25 in the semiconductor layer 21'; the second deep well 211 encompasses a lower boundary of the first deep well 25. The second deep well 211 can be formed by, for example but not limited to, an ion implantation process step which implants second conductivity type impurities in the substrate 21 and/or the semiconductor layer 21' in the form of accelerated ions, to form the second deep well 211. For example, when the semiconductor layer 21' is an epitaxial layer formed on the substrate 21, the second conductivity type impurities are implanted into the substrate 21 in the form of accelerated ions, and thereafter the epitaxial layer is formed on the substrate 21 by an epitaxial growth process step to form the semiconductor layer 21', and then the second deep well 211 is formed at or around an interface between the substrate 21 and the semiconductor layer 21' by a thermal process step, wherein part of the second conductivity type impurities thermally diffuse from the substrate 21 to the semiconductor layer 21' in the thermal process step to form the second deep well 211.

Still referring to FIG. 2, the drift well 22 having the second conductivity type is formed on and in contact with the first deep well 25 in the semiconductor layer 21'; the drift well 22 overlays an upper boundary of the first deep well 25, and is below and in contact with the top surface 21a in the vertical direction. The first well 25' having the first conductivity type is formed on the second deep well 211 outside the device region 23a, and is in contact with and electrically connected to the first deep well 25. The first well 25' is located below the top surface 21a and in contact with the top surface 21a in the vertical direction. The second well 211' having the second conductivity type is formed on and in contact with the second deep well 211 outside the device region 23a and outside the first well 25', and the second well 211' is electrically connected to the second deep well 211. The second well 211' having the second conductivity type is located below the top surface 21a and in contact with the top surface 21a in the vertical direction.

The first conductivity type contact 25" having the first conductivity type is formed in the first well 25'; the first conductivity type contact 25" is located below the top surface 21a and in contact with the top surface 21a in the vertical direction, to serve as an electrical contact of the first well 25'. The second conductivity type contact 211" having the second conductivity type is formed in the second well 211'; the second conductivity type contact 211" is located below the top surface 21a and in contact with the top surface 21a in the vertical direction, to serve as an electrical contact of the second well 211'.

The body region 26 having the first conductivity type is formed in the drift well 22 within the device region 23a, and is located below and in contact with the top surface 21a in the vertical direction. The body contact 26' having the first conductivity type is formed in the body region 26, and is located below and in contact with the top surface 21a in the vertical direction, wherein the body contact 26' serves as an electrical contact of the body region 26. The high voltage well 212 having the second conductivity type is formed in the second deep well 211; the high voltage well 212 is not in contact with any of the first deep well 25, the first well 25', and the second well 211', and at least part of the high voltage well 212 is located right below all of the drift region 22a. In this embodiment, the high voltage well 212 and the second deep well 211 are defined by a same lithography process step to have a same ion implantation area, and therefore, the area of the high voltage well 212 completely overlaps the area of the second deep well 211 as viewed from a direction perpendicular to the bottom surface 21b.

The gate 27 is formed on the top surface 21a within the device region 23a, wherein part of the drift well 22 is located below and in contact with the gate 27 in the vertical direction. The gate 27 at least includes: a dielectric layer 271, a conductive layer 272, and a spacer layer 273. The dielectric layer 271 is formed on the top surface 21a and in contact with the top surface 21a, and is in contact with the drift well 22 in the vertical direction. The conductive layer 272 is formed on the dielectric layer 271 and in contact with the dielectric layer 271, to serve as an electrical contact of the gate 27. The spacer layer 273 is formed outside of two sidewalls of the conductive layer 272, to serve as an electrical insulation layer of the gate 27.

Still referring to FIG. 2, the source 28 and the drain 29 have the second conductivity type. The source 28 and the drain 29 are formed below the top surface 21a and in contact with the top surface 21a in the vertical direction within the device region 23a, and are located below and outside two sides of the gate 27 respectively, wherein the source 28 is located in the body region 26, and the drain 29 is located in the drift well 22, at a location near the right side of the gate 27 (i.e., the side that is away from the body region 26). An inversion region 26a is formed in the body region 26 between the source 28 and the drift well 22 in a channel direction (indicated by a dashed arrow), and is in contact with the top surface 21a, to serve as an inversion current channel in an ON operation of the high voltage device 200. A drift region 22a is formed in the drift well 22 between the drain 29 and the body region 26 in the channel direction, and is in contact with the top surface 21a, to serve as a drift current channel in the ON operation of the high voltage device 200.

Note that the term "inversion current channel" means thus. Taking this embodiment as an example, when the high voltage device 200 operates in ON operation due to the voltage applied to the gate 27, an inversion layer is formed below the gate 27, between the source 28 and the drift current channel, so that a conduction current flows through the region of the inversion layer, which is the inverse current channel known to a person having ordinary skill in the art.

Note that the term "drift current channel" means thus. Taking this embodiment as an example, the drift current channel refers to a region where the conduction current passes through in a drifting manner when the high-voltage device 200 operates in ON operation, which is known to a person having ordinary skill in the art.

Note that the top surface 21a as referred to does not mean a completely flat plane but refers to the surface of the semiconductor layer 21'. In the present embodiment, for example, a part of the top surface 21a where the drift oxide region 24 is in contact with has a recessed portion.

Note that the gate 27 includes a dielectric layer 271 in contact with the top surface 21a, a conductive layer 272 on the dielectric layer 271, and a spacer layer 273 having electrical insulation properties, which is known to a person having ordinary skill in the art, so the details thereof are not redundantly explained here.

Note that the above-mentioned "first conductivity type" and "second conductivity type" mean that impurities of corresponding conductivity types are doped in regions of the high voltage MOS device (for example but not limited to the aforementioned well region, body region, source and drain, etc.), so that the regions have the corresponding conductivity types. For example the first conductivity type is N-type and the second conductivity type is P-type, or the first conductivity type is P-type and the second conductivity type is N-type.

In addition, the term "high voltage MOS device" refers to a transistor device wherein a voltage applied to the drain thereof in normal operation is higher than a specific voltage, such as 5V. A lateral distance (length of the drift region) between the body region 26 and the drain 29 of the high voltage device 200 is determined according to the required operation voltage during normal operation, so that the device can operate at or higher than the aforementioned specific voltage, which is known to a person having ordinary skill in the art, so the details thereof are not redundantly explained here.

One technical feature of the present invention which is advantageous over the prior art is that, according to the present invention, taking the embodiment shown in FIG. 2 as an example, when the high voltage device 200 operates, the concentration of the second conductivity type impurities of the high voltage well 212 is higher than the concentration of the second conductivity type impurities of the second deep well 211; this arrangement suppresses the current gain of a parasitic transistor formed by the first deep well 25, the second deep well 211 and the substrate 21 in the high voltage device 200, and the base current of the parasitic transistor is decreased, so that the parasitic transistor is prevented from being turned ON. In the meanwhile, when there is another device which is adjacent to the high voltage device 200, a latch-up current flowing through the parasitic transistor of the and high voltage device 200 and the parasitic transistor of that is adjacent device is also suppressed. Therefore, the safe operation area (SOA) of the high voltage device 200 is increased, and the performance is improved.

Figure 3:
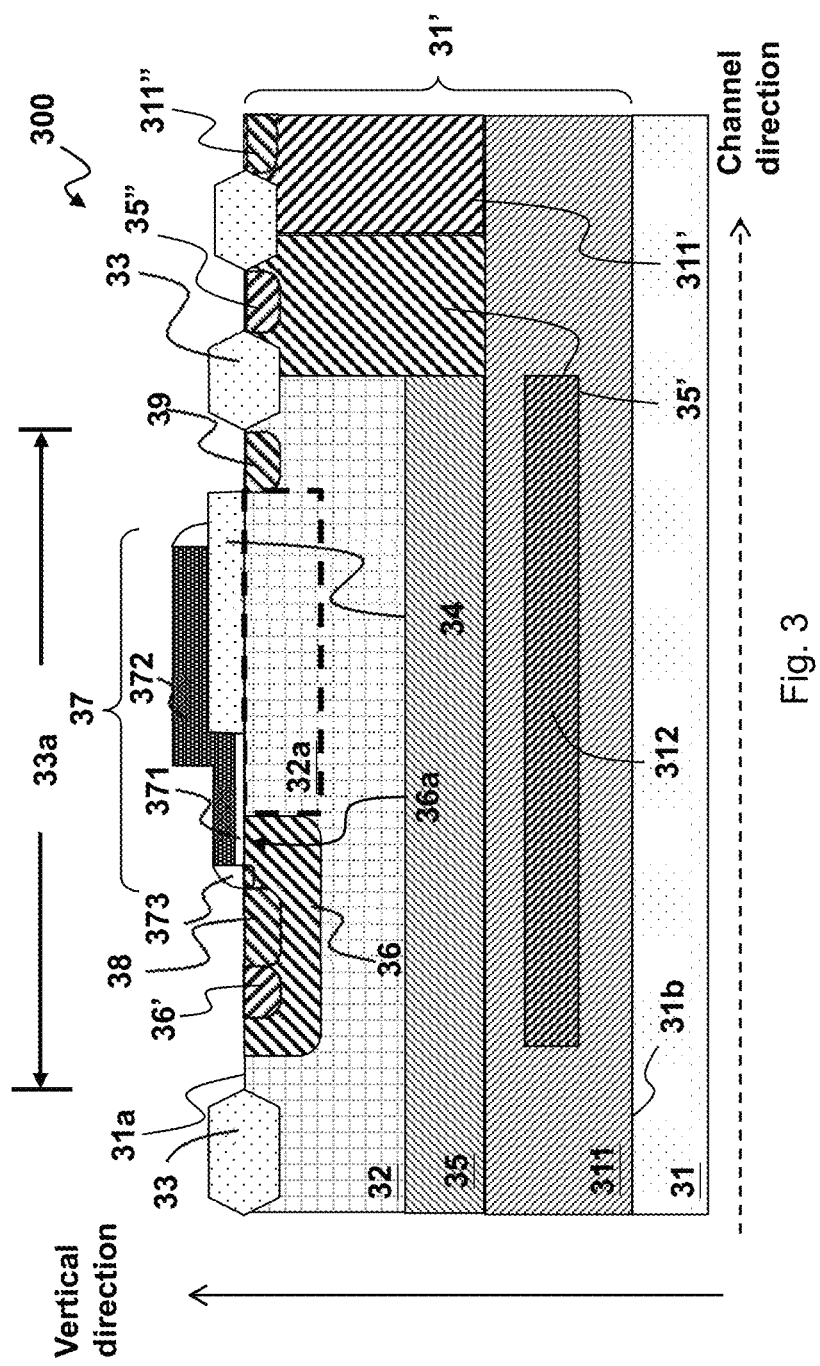
FIG. 3 shows a second embodiment of the present invention.

Please refer to FIG. 3 which shows a second embodiment of the present invention. FIG. 3 shows a schematic diagram of a cross-section view of a high voltage device 300. As shown in FIG. 3, the high voltage device 300 includes a semiconductor layer 31', a first deep well 35, a second deep well 311, a drift well 32, an isolation structure 33, a drift oxide region 34, a high voltage well 312, a body region 36, a body contact 36', a gate 37, a source 38, a drain 39, a first well 35', a first conductivity type contact 35", a second well 311', and a second conductivity type contact 311".

The semiconductor layer 31' is formed on the substrate 31, and the semiconductor layer 31' has a top surface 31a and a bottom surface 31b that is opposite to the top surface 31a in the vertical direction (as indicated by the direction of the solid arrow in FIG. 3). The substrate 31 is, for example but not limited to, a first conductivity type silicon substrate. The semiconductor layer 31', for example, is formed on the substrate 31 by an epitaxial growth process step, or a part of the substrate 31 is used as the semiconductor layer 31'. The semiconductor layer 31' can be formed by any method known to a person having ordinary skill in the art, so the details thereof are not redundantly explained here.

Still referring to FIG. 3, the isolation structure 33 is formed on the top surface 31a and in contact with the top surface 31a, for defining an device region 33a. The isolation structure 33 is not limited to the local oxidation of silicon (LOCOS) structure as shown in the figure; for example, it may be a shallow trench isolation (STI) structure instead. The device region 33a is an active region of the operation of the high voltage device 300. The drift oxide region 34 is formed on the top surface 31a and in contact with the top surface 31a, and the drift oxide region 34 is located on the drift region 32a (as indicated by the dashed frame shown in FIG. 3) within the device region 23a, and is in contact with the drift region 22a.

The first deep well 35 having a first conductivity type is formed in the semiconductor layer 31'. The first deep well 35 can be formed by, for example but not limited to, an ion implantation process step which implants first conductivity type impurities in the semiconductor layer 31' in the form of accelerated ions, to form the first deep well 35. The second deep well 311 having a second conductivity type is formed below and in contact with the first deep well 35 in the semiconductor layer 31'; the second deep well 311 encompasses a lower boundary of the first deep well 35. The second deep well 311 can be formed by, for example but not limited to, an ion implantation process step which implants second conductivity type impurities in the substrate 31 and/or the semiconductor layer 31' in the form of accelerated ions, to form the second deep well 311. For example, when the semiconductor layer 31' is an epitaxial layer formed on the substrate 31, the second conductivity type impurities are implanted into the substrate 31 in the form of accelerated ions, and thereafter the epitaxial layer is formed on the substrate 31 by an epitaxial growth process step to form the semiconductor layer 31', and then the second deep well 311 is formed at or around an interface between the substrate 31 and the semiconductor layer 31' by a thermal process step, wherein part of the second conductivity type impurities thermally diffuse from the substrate 31 to the semiconductor layer 31' in the thermal process step to form the second deep well 311.

Still referring to FIG. 3, the drift well 32 having the second conductivity type is formed on and in contact with the first deep well 35 in the semiconductor layer 31'; the drift well 32 overlays an upper boundary of the first deep well 35, and is below and in contact with the top surface 31a in the vertical direction. The first well 35' having the first conductivity type is formed on the second deep well 311 outside the device region 33a, and is in contact with and electrically connected to the first deep well 35. The first well 35' is located below the top surface 31a and in contact with the top surface 31a in the vertical direction. The second well 311' having the second conductivity type is formed on and in contact with the second deep well 311 outside the device region 33a and outside the first well 35', and the second well 311' is electrically connected to the second deep well 311. The second well 311' having the second conductivity type is located below the top surface 31a and in contact with the top surface 31a in the vertical direction.

The first conductivity type contact 35" having the first conductivity type is formed in the first well 35'; the first conductivity type contact 35" is located below the top surface 31a and in contact with the top surface 31a in the vertical direction, to serve as an electrical contact of the first well 35'. The second conductivity type contact 311" having the second conductivity type is formed in the second well 311'; the second conductivity type contact 311" is located below the top surface 31a and in contact with the top surface 31a in the vertical direction, to serve as an electrical contact of the second well 311'.

The body region 36 having the first conductivity type is formed in the drift well 32 within the device region 33a, and is located below and in contact with the top surface 31a in the vertical direction. The body contact 36' having the first conductivity type is formed in the body region 36, and is located below and in contact with the top surface 31a in the vertical direction, wherein the body contact 36' serves as an electrical contact of the body region 36. The high voltage well 312 having the second conductivity type is formed in the second deep well 311; the high voltage well 312 is not in contact with any of the first deep well 35, the first well 35', and the second well 311', and at least part of the high voltage well 312 is located right below all of the drift region 32a. In this embodiment, the high voltage well 312 and the second deep well 311 are defined by a same lithography process step to have a same ion implantation area, and therefore, the area of the high voltage well 312 completely overlaps the area of the second deep well 311 as viewed from a direction perpendicular to the bottom surface 31b.

The gate 37 is formed on the top surface 31a within the device region 33a, wherein part of the drift well 32 is located below and in contact with the gate 37 in the vertical direction. The gate 37 at least includes: a dielectric layer 371, a conductive layer 372, and a spacer layer 373. The dielectric layer 371 is formed on the top surface 31a and in contact with the top surface 31a, and is in contact with the drift well 32 in the vertical direction. The conductive layer 372 is formed on the dielectric layer 371 and in contact with the dielectric layer 371, to serve as an electrical contact of the gate 37. The spacer layer 373 is formed outside of two sidewalls of the conductive layer 372, to serve as an electrical insulation layer of the gate 37.

Still referring to FIG. 3, the source 38 and the drain 39 have the second conductivity type. The source 38 and the drain 39 are formed below the top surface 31a and in contact with the top surface 31a in the vertical direction within the device region 33a, and are located below and outside two sides of the gate 37 respectively, wherein the source 38 is located in the body region 36, and the drain 39 is located in the drift well 32, at a location near the right side of the gate 37 (i.e., the side that is away from the body region 36). An inversion region 36a is formed in the body region 36 between the source 38 and the drift well 32 in a channel direction (indicated by a dashed arrow), and is in contact with the top surface 31a, to serve as an inversion current channel in an ON operation of the high voltage device 300. A drift region 32a is formed in the drift well 32 between the drain 39 and the body region 36 in the channel direction, and is in contact with the top surface 31a, to serve as a drift current channel in the ON operation of the high voltage device 300.

This embodiment differs from the first embodiment in that, in the first embodiment, the drift oxide region 24 is a LOCOS structure, while in this embodiment, the drift oxide region 34 is a chemical vapor deposition (chemical vapor deposition, CVD) oxide structure. The CVD oxide structure is formed by a CVD process deposition step. CVD deposition is well known to a person having ordinary skill in the art, so the details thereof are not redundantly explained here.

Figure 4:
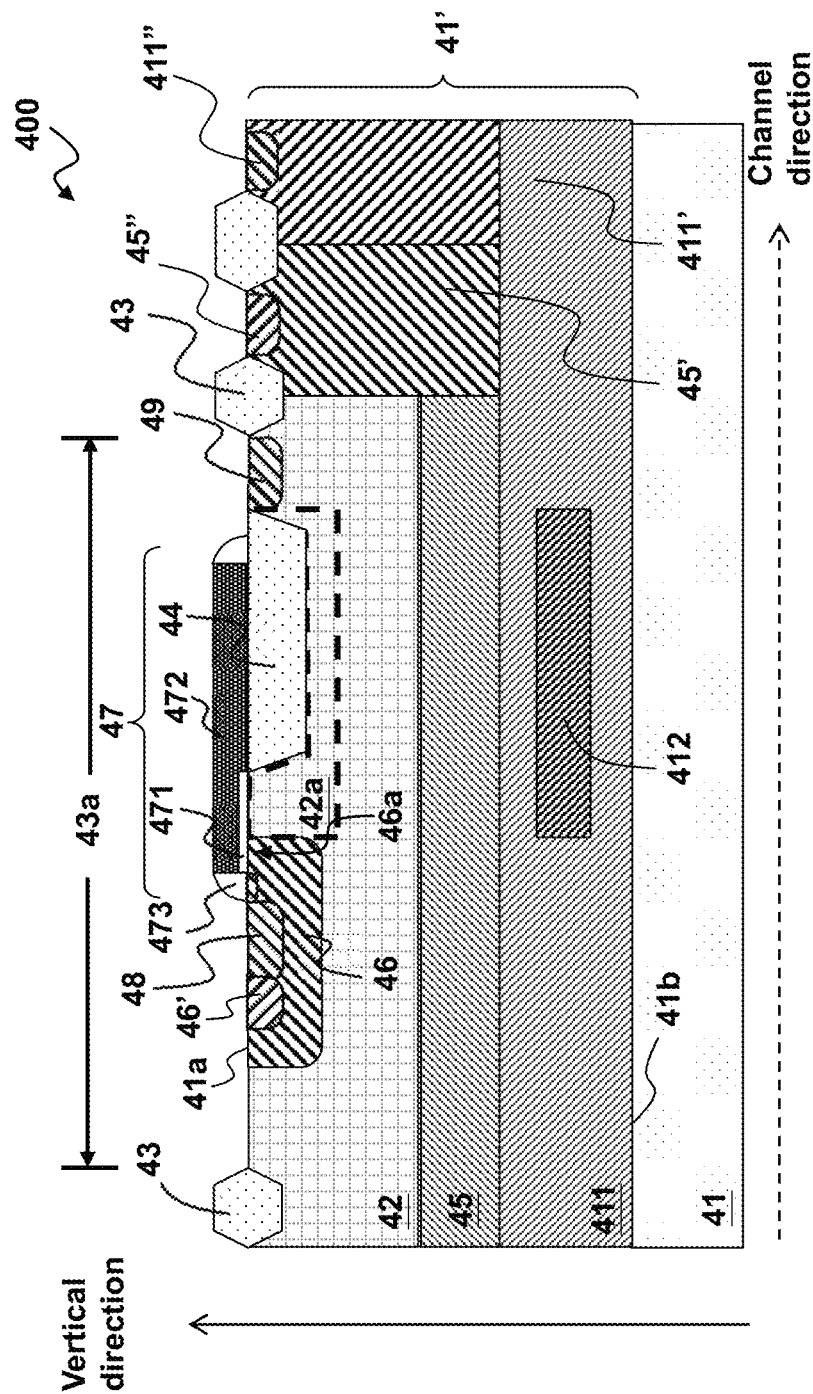
FIG. 4 shows a third embodiment of the present invention.

Please refer to FIG. 4 which shows a third embodiment of the present invention. FIG. 4 shows a schematic diagram of a cross-section view of a high voltage device 400. As shown in FIG. 4, the high voltage device 400 includes a semiconductor layer 41', a first deep well 45, a second deep well 411, a drift well 42, an isolation structure 43, a drift oxide region 44, a high voltage well 412, a body region 46, a body contact 46', a gate 47, a source 48, a drain 49, a first well 411', a first conductivity type contact 411", a second well 412', and a second conductivity type contact 412".

The semiconductor layer 41' is formed on the substrate 41, and the semiconductor layer 41' has a top surface 41a and a bottom surface 41b that is opposite to the top surface 41a in the vertical direction (as indicated by the direction of the solid arrow in FIG. 4). The substrate 41 is, for example but not limited to, a first conductivity type silicon substrate. The semiconductor layer 41', for example, is formed on the substrate 41 by an epitaxial growth process step, or a part of the substrate 41 is used as the semiconductor layer 41'. The semiconductor layer 41' can be formed by any method known to a person having ordinary skill in the art, so the details thereof are not redundantly explained here.

Still referring to FIG. 4, the isolation structure 43 is formed on the top surface 41a and in contact with the top surface 41a, for defining an device region 43a. The isolation structure 43 is not limited to the local oxidation of silicon (LOCOS) structure as shown in the figure; for example, it may be a shallow trench isolation (STI) structure instead. The device region 43a is an active region of the operation of the high voltage device 400. The drift oxide region 44 is formed on the top surface 41a and in contact with the top surface 41a, and the drift oxide region 44 is located on the drift region 42a (as indicated by the dashed frame shown in FIG. 4) within the device region 43a, and is in contact with the drift region 42a.

The first deep well 45 having a first conductivity type is formed in the semiconductor layer 41'. The first deep well 45 can be formed by, for example but not limited to, an ion implantation process step which implants first conductivity type impurities in the semiconductor layer 41' in the form of accelerated ions, to form the first deep well 45. The second deep well 411 having a second conductivity type is formed below and in contact with the first deep well 45 in the semiconductor layer 41'; the second deep well 411 encompasses a lower boundary of the first deep well 45. The second deep well 411 can be formed by, for example but not limited to, an ion implantation process step which implants second conductivity type impurities in the substrate 41 and/or the semiconductor layer 41' in the form of accelerated ions, to form the second deep well 411. For example, when the semiconductor layer 41' is an epitaxial layer formed on the substrate 41, the second conductivity type impurities are implanted into the substrate 41 in the form of accelerated ions, and thereafter the epitaxial layer is formed on the substrate 41 by an epitaxial growth process step to form the semiconductor layer 41', and then the second deep well 411 is formed at or around an interface between the substrate 41 and the semiconductor layer 41' by a thermal process step, wherein part of the second conductivity type impurities thermally diffuse from the substrate 41 to the semiconductor layer 41' in the thermal process step to form the second deep well 411.

Still referring to FIG. 4, the drift well 42 having the second conductivity type is formed on and in contact with the first deep well 45 in the semiconductor layer 41'; the drift well 42 overlays an upper boundary of the first deep well 45, and is below and in contact with the top surface 41a in the vertical direction. The first well 45' having the first conductivity type is formed on the second deep well 411 outside the device region 43a, and is in contact with and electrically connected to the first deep well 45. The first well 45' is located below the top surface 41a and in contact with the top surface 41a in the vertical direction. The second well 411' having the second conductivity type is formed on and in contact with the second deep well 411 outside the device region 43a and outside the first well 45', and the second well 411' is electrically connected to the second deep well 411. The second well 411' having the second conductivity type is located below the top surface 41a and in contact with the top surface 41a in the vertical direction.

The first conductivity type contact 45" having the first conductivity type is formed in the first well 45'; the first conductivity type contact 45" is located below the top surface 41a and in contact with the top surface 41a in the vertical direction, to serve as an electrical contact of the first well 45'. The second conductivity type contact 411" having the second conductivity type is formed in the second well 411'; the second conductivity type contact 411" is located below the top surface 41a and in contact with the top surface 41a in the vertical direction, to serve as an electrical contact of the second well 411'.

The body region 46 having the first conductivity type is formed in the drift well 42 within the device region 43a, and is located below and in contact with the top surface 41a in the vertical direction. The body contact 46' having the first conductivity type is formed in the body region 46, and is located below and in contact with the top surface 41a in the vertical direction, wherein the body contact 46' serves as an electrical contact of the body region 46. The high voltage well 412 having the second conductivity type is formed in the second deep well 411; the high voltage well 412 is not in contact with any of the first deep well 45, the first well 45', and the second well 411', and at least part of the high voltage well 412 is located right below all of the drift region 42a. In this embodiment, the high voltage well 412 and the second deep well 411 are defined by a same lithography process step to have a same ion implantation area, and therefore, the area of the high voltage well 412 completely overlaps the area of the second deep well 411 as viewed from a direction perpendicular to the bottom surface 41b.

The gate 47 is formed on the top surface 41a within the device region 43a, wherein part of the drift well 42 is located below and in contact with the gate 47 in the vertical direction. The gate 47 at least includes: a dielectric layer 471, a conductive layer 472, and a spacer layer 473. The dielectric layer 471 is formed on the top surface 41a and in contact with the top surface 41a, and is in contact with the drift well 42 in the vertical direction. The conductive layer 472 is formed on the dielectric layer 471 and in contact with the dielectric layer 471, to serve as an electrical contact of the gate 47. The spacer layer 473 is formed outside of two sidewalls of the conductive layer 472, to serve as an electrical insulation layer of the gate 47.

Still referring to FIG. 4, the source 48 and the drain 49 have the second conductivity type. The source 48 and the drain 49 are formed below the top surface 41a and in contact with the top surface 41a in the vertical direction within the device region 43a, and are located below and outside two sides of the gate 47 respectively, wherein the source 48 is located in the body region 46, and the drain 49 is located in the drift well 42, at a location near the right side of the gate 47 (i.e., the side that is away from the body region 46). An inversion region 46a is formed in the body region 46 between the source 48 and the drift well 42 in a channel direction (indicated by a dashed arrow), and is in contact with the top surface 41a, to serve as an inversion current channel in an ON operation of the high voltage device 400. A drift region 42a is formed in the drift well 42 between the drain 49 and the body region 46 in the channel direction, and is in contact with the top surface 41a, to serve as a drift current channel in the ON operation of the high voltage device 400.

This embodiment differs from the first embodiment in that, in the first embodiment, the drift oxide region 24 is a LOCOS structure, while in this embodiment, the drift oxide region 44 is a shallow trench isolation (STI) structure. The STI structure is well known to a person having ordinary skill in the art, so the details thereof are not redundantly explained here.

Please refer to FIG. 5 which shows a fourth embodiment of the present invention. FIG. 5 shows a schematic diagram of a cross-section view of a high voltage device 500. As shown in FIG. 5, the high voltage device 500 includes a semiconductor layer 51', a first deep well 55, a second deep well 511, a drift well 52, an isolation structure 53, a drift oxide region 54, a high voltage well 512, a body region 56, a body contact 56', a gate 57, a source 58, a drain 59, a first well 55', a first conductivity type contact 511", a second well 512', and a second conductivity type contact 512".

The semiconductor layer 51' is formed on the substrate 51, and the semiconductor layer 51' has a top surface 51a and a bottom surface 51b that is opposite to the top surface 51a in the vertical direction (as indicated by the direction of the solid arrow in FIG. 5). The substrate 51 is, for example but not limited to, a first conductivity type silicon substrate. The semiconductor layer 51', for example, is formed on the substrate 51 by an epitaxial growth process step, or a part of the substrate 51 is used as the semiconductor layer 51'. The semiconductor layer 51' can be formed by any method known to a person having ordinary skill in the art, so the details thereof are not redundantly explained here.

Still referring to FIG. 5, the isolation structure 53 is formed on the top surface 51a and in contact with the top surface 51a, for defining an device region 53a. The isolation structure 53 is not limited to the local oxidation of silicon (LOCOS) structure as shown in the figure; for example, it may be a shallow trench isolation (STI) structure instead. The device region 53a is an active region of the operation of the high voltage device 500.

The first deep well 55 having a first conductivity type is formed in the semiconductor layer 51'. The first deep well 55 can be formed by, for example but not limited to, an ion implantation process step which implants first conductivity type impurities in the semiconductor layer 51' in the form of accelerated ions, to form the first deep well 55. The second deep well 511 having a second conductivity type is formed below and in contact with the first deep well 55 in the semiconductor layer 51'; the second deep well 511 encompasses a lower boundary of the first deep well 55. The second deep well 511 can be formed by, for example but not limited to, an ion implantation process step which implants second conductivity type impurities in the substrate 51 and/or the semiconductor layer 51' in the form of accelerated ions, to form the second deep well 511. For example, when the semiconductor layer 51' is an epitaxial layer formed on the substrate 51, the second conductivity type impurities are implanted into the substrate 51 in the form of accelerated ions, and thereafter the epitaxial layer is formed on the substrate 51 by an epitaxial growth process step to form the semiconductor layer 51', and then the second deep well 511 is formed at or around an interface between the substrate 51 and the semiconductor layer 51' by a thermal process step, wherein part of the second conductivity type impurities thermally diffuse from the substrate 51 to the semiconductor layer 51' in the thermal process step to form the second deep well 511.

Still referring to FIG. 5, the drift well 52 having the second conductivity type is formed on and in contact with the first deep well 55 in the semiconductor layer 51'; the drift well 52 overlays an upper boundary of the first deep well 55, and is below and in contact with the top surface 51a in the vertical direction. The first well 55' having the first conductivity type is formed on the second deep well 511 outside the device region 53a, and is in contact with and electrically connected to the first deep well 55. The first well 55' is located below the top surface 51a and in contact with the top surface 51a in the vertical direction. The second well 511' having the second conductivity type is formed on and in contact with the second deep well 511 outside the device region 53a and outside the first well 55', and the second well 511' is electrically connected to the second deep well 511. The second well 511' having the second conductivity type is located below the top surface 51a and in contact with the top surface 51a in the vertical direction.

The first conductivity type contact 55" having the first conductivity type is formed in the first well 55'; the first conductivity type contact 55" is located below the top surface 51a and in contact with the top surface 51a in the vertical direction, to serve as an electrical contact of the first well 55'. The second conductivity type contact 511" having the second conductivity type is formed in the second well 511'; the second conductivity type contact 511" is located below the top surface 51a and in contact with the top surface 51a in the vertical direction, to serve as an electrical contact of the second well 511'.

The body region 56 having the first conductivity type is formed in the drift well 52 within the device region 53a, and is located below and in contact with the top surface 51a in the vertical direction. The body contact 56' having the first conductivity type is formed in the body region 56, and is located below and in contact with the top surface 51a in the vertical direction, wherein the body contact 56' serves as an electrical contact of the body region 56. The high voltage well 512 having the second conductivity type is formed in the second deep well 511; the high voltage well 512 is not in contact with any of the first deep well 55, the first well 55', and the second well 511', and at least part of the high voltage well 512 is located right below all of the drift region 52a. In this embodiment, the high voltage well 512 and the second deep well 511 are defined by a same lithography process step to have a same ion implantation area, and therefore, the area of the high voltage well 512 completely overlaps the area of the second deep well 511 as viewed from a direction perpendicular to the bottom surface 51b.

The gate 57 is formed on the top surface 51a within the device region 53a, wherein part of the drift well 52 is located below and in contact with the gate 57 in the vertical direction. The gate 57 at least includes: a dielectric layer 571, a conductive layer 572, and a spacer layer 573. The dielectric layer 571 is formed on the top surface 51a and in contact with the top surface 51a, and is in contact with the drift well 52 in the vertical direction. The conductive layer 572 is formed on the dielectric layer 571 and in contact with the dielectric layer 571, to serve as an electrical contact of the gate 57. The spacer layer 573 is formed outside of two sidewalls of the conductive layer 572, to serve as an electrical insulation layer of the gate 57.

Still referring to FIG. 5, the source 58 and the drain 59 have the second conductivity type. The source 58 and the drain 59 are formed below the top surface 51a and in contact with the top surface 51a in the vertical direction within the device region 53a, and are located below and outside two sides of the gate 57 respectively, wherein the source 58 is located in the body region 56, and the drain 59 is located in the drift well 52, at a location near the right side of the gate 57 (i.e., the side that is away from the body region 56). An inversion region 56a is formed in the body region 56 between the source 58 and the drift well 52 in a channel direction (indicated by a dashed arrow), and is in contact with the top surface 51a, to serve as an inversion current channel in an ON operation of the high voltage device 500. A drift region 52a is formed in the drift well 52 between the drain 59 and the body region 56 in the channel direction, and is in contact with the top surface 51a, to serve as a drift current channel in the ON operation of the high voltage device 500.

This embodiment differs from the first embodiment in that, in the first embodiment, the drift oxide region 24 is a LOCOS structure, and in this embodiment, the high voltage device 500 does not include any drift oxide region on the drift region 52a. The lateral distance (length of the drift region 52a) between the body region 56 and the drain 59 of the high voltage device 500 is determined according to the operation voltage that the high voltage device is designed to operate with.

Figure 6A:
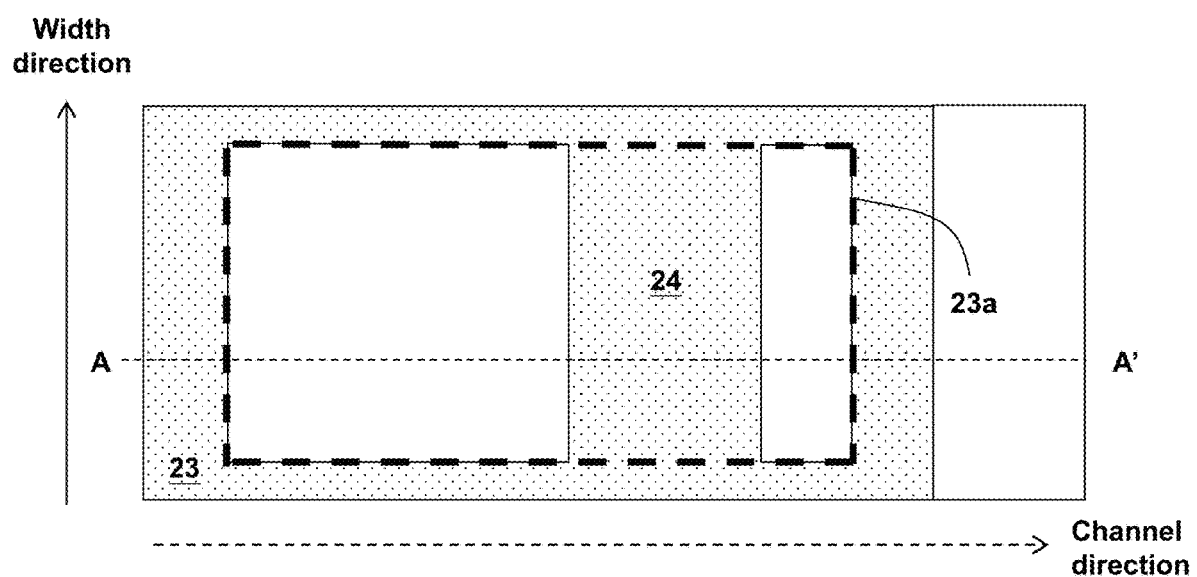
FIGS. 6A-6G show a fifth embodiment of the present invention.
Figure 6B:
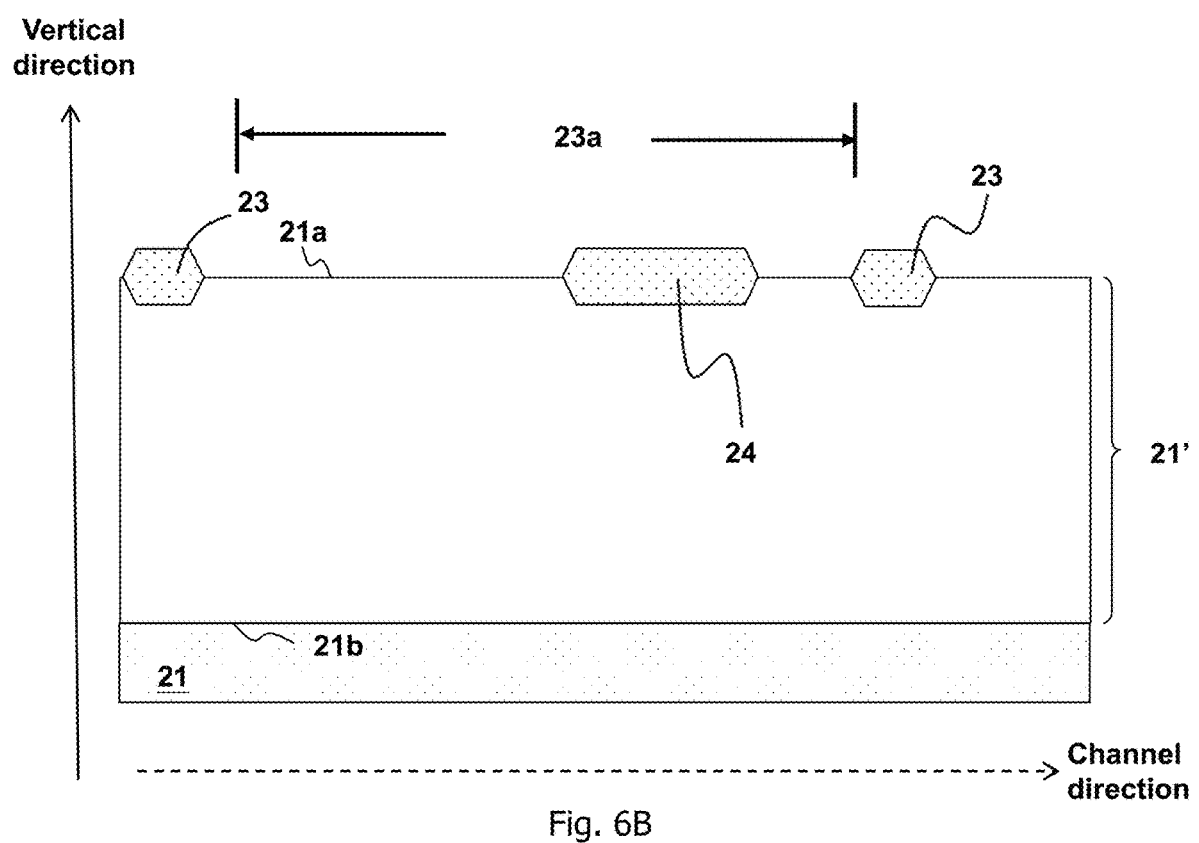

Please refer to FIGS. 6A to 6G, which show a fifth embodiment of the present invention. This embodiment shows schematic diagrams of a manufacturing method of the high voltage device 200 according to the present invention. FIG. 6B shows a schematic diagram of a cross-section view taken along the A-A' cross-section line shown in FIG. 6A. As shown in FIGS. 6A and 6B, first, a semiconductor layer 21' is formed on the substrate 21, wherein the semiconductor layer 21' has a top surface 21a and a bottom surface 21b that is opposite to the top surface 21a in the vertical direction (as indicated by the direction of the solid arrow in FIG. 6B). The substrate 21 is, for example but not limited to, a first conductivity type silicon substrate. The semiconductor layer 21', for example, is formed on the substrate 21 by an epitaxial growth process step, or a part of the substrate 21 is used as the semiconductor layer 21'. The semiconductor layer 21' can be formed by any method known to a person having ordinary skill in the art, so the details thereof are not redundantly explained here.

Still referring to FIGS. 6A and 6B, next, an isolation structure 23 and a drift oxide region 24 are formed on and in contact with the top surface 21a. The isolation structure 23 is for defining the device region 23a (as indicated by a dashed frame shown in FIG. 6A). The isolation structure 23 is not limited to the local oxidation of silicon (LOCOS) structure as shown in the figure; for example, it may be a shallow trench isolation (STI) structure instead. The device region 23a is an active region of the operation of the high voltage device 200. The drift oxide region 24 is formed on the top surface 21a and in contact with the top surface 21a, and the drift oxide region 24 is located on the drift region 22a (as indicated by the dashed frame shown in FIG. 2) within the device region 23a, and is in contact with the drift region 22a.

Figure 6C:
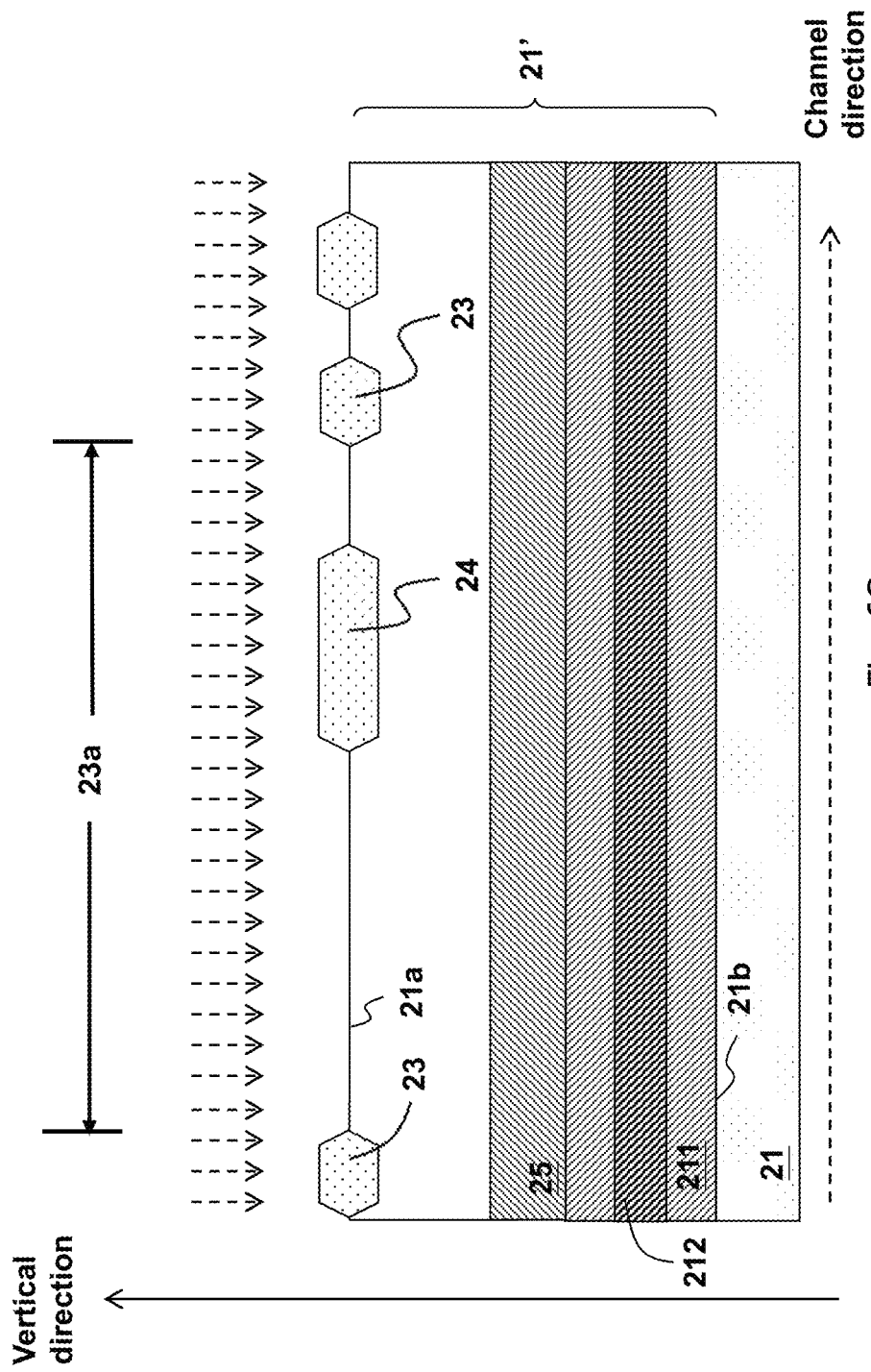

Next, referring to FIG. 6C, a first deep well 25 having a first conductivity type is formed in the semiconductor layer 21'. The first deep well 25 can be formed by, for example but not limited to, an ion implantation process step which implants first conductivity type impurities in the semiconductor layer 21' in the form of accelerated ions, to form the first deep well 25. A second deep well 211 having a second conductivity type is formed below and in contact with the first deep well 25 in the semiconductor layer 21'; the second deep well 211 encompasses a lower boundary of the first deep well 25. The second deep well 211 can be formed by, for example but not limited to, an ion implantation process step which implants second conductivity type impurities in the substrate 21 and/or the semiconductor layer 21' in the form of accelerated ions, to form the second deep well 211. For example, when the semiconductor layer 21' is an epitaxial layer formed on the substrate 21, the second conductivity type impurities are implanted into the substrate 21 in the form of accelerated ions, and thereafter the epitaxial layer is formed on the substrate 21 by an epitaxial growth process step to form the semiconductor layer 21', and then the second deep well 211 is formed at or around an interface between the substrate 21 and the semiconductor layer 21' by a thermal process step, wherein part of the second conductivity type impurities thermally diffuse from the substrate 21 to the semiconductor layer 21' in the thermal process step to form the second deep well 211.

Next, still referring to FIG. 6C, a high voltage well 212 having the second conductivity type is formed in the second deep well 211; the high voltage well 212 is not in contact with any of the first deep well 25, the first well 25', and the second well 211' (to be formed in future steps), and at least part of the high voltage well 212 is located right below all of the drift region 22a (referring to FIG. 2). In this embodiment, the high voltage well 212 and the second deep well 211 are defined by a same lithography process step to have a same ion implantation area, and therefore, the area of the high voltage well 212 completely overlaps the area of the second deep well 211 as viewed from a direction perpendicular to the bottom surface 21b.

Next, referring to FIG. 6D, a drift well 22 having the second conductivity type is formed on and in contact with the first deep well 25 in the semiconductor layer 21'; the drift well 22 overlays an upper boundary of the first deep well 25, and is below and in contact with the top surface 21a in the vertical direction. The drift well 22 can be formed by, for example but not limited to, an ion implantation process step, which implants second conductivity type impurities in the semiconductor layer 21' in the form of accelerated ions as indicated by dashed arrows shown in FIG. 6D, to form the drift well 22.

Figure 6D:
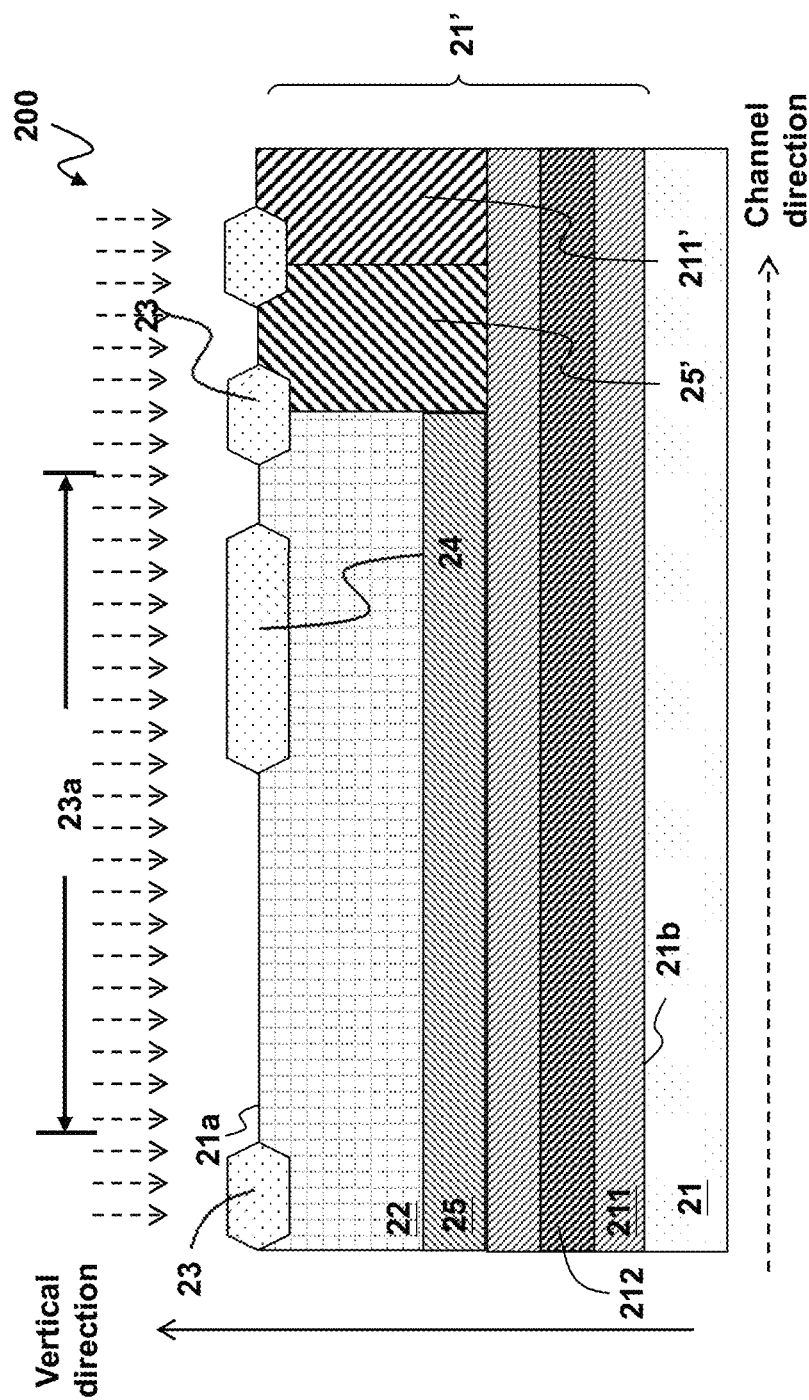

Next, still referring to FIG. 6D, a first well 25' having the first conductivity type is formed on the second deep well 211 outside the device region 23a, and is in contact with and electrically connected to the first deep well 25. The first well 25' is located below the top surface 21a and in contact with the top surface 21a in the vertical direction. A second well 211' having the second conductivity type is formed on and in contact with the second deep well 211 outside the device region 23a and outside the first well 25', and the second well 211' is electrically connected to the second deep well 211. The second well 211' having the second conductivity type is located below the top surface 21a and in contact with the top surface 21a in the vertical direction.

Figure 6E:
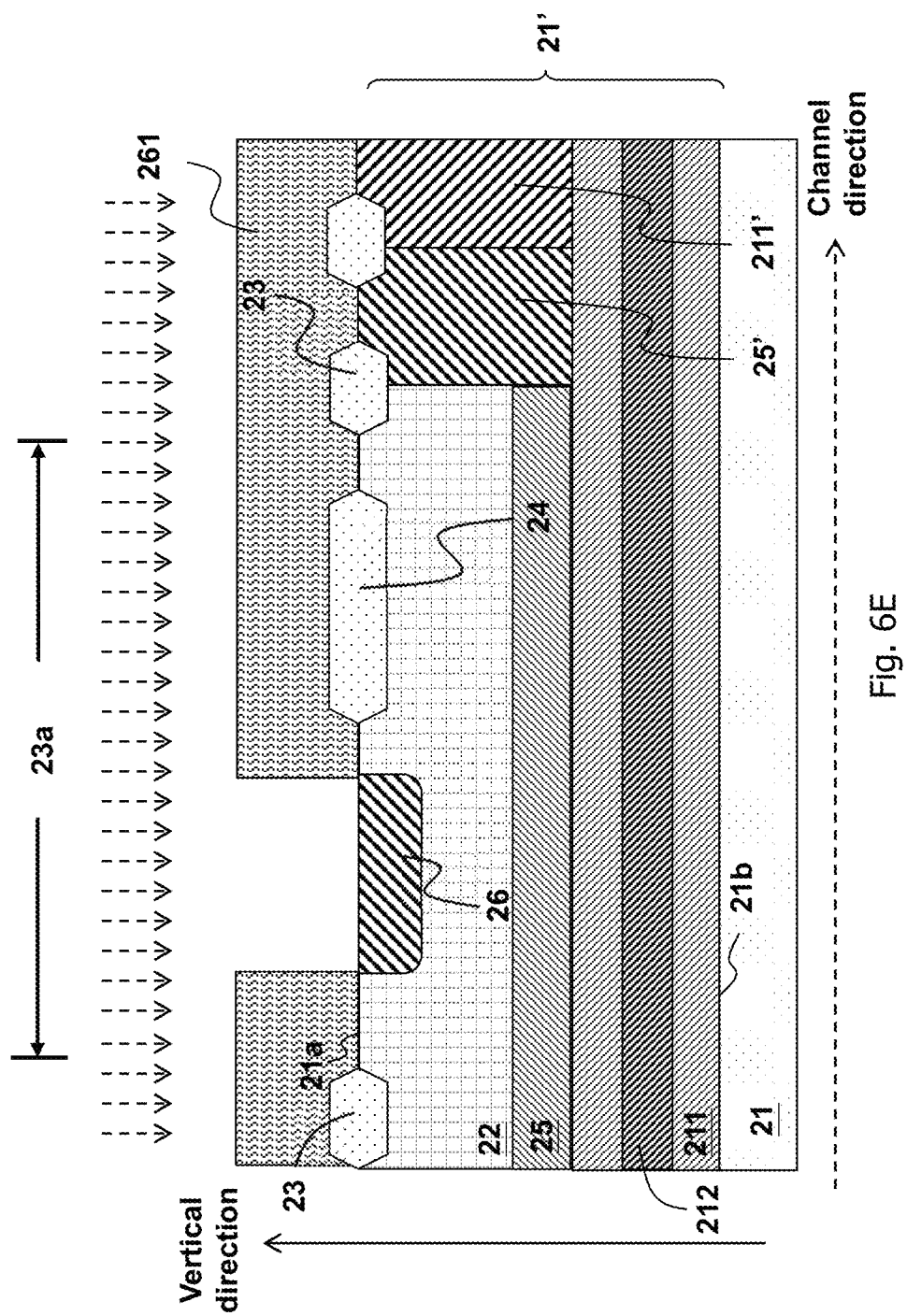

Next, referring to FIG. 6E, a body region 26 having the first conductivity type is formed in the drift well 22 within the device region 23a, and is located below and in contact with the top surface 21a in the vertical direction. The body region 26 can be formed by, for example but not limited to, a lithography process step and an ion implantation process step, wherein the lithography process step includes forming a photo-resist layer 261 as a mask, and the ion implantation process step implants first conductivity type impurities in the drift well 22 in the form of accelerated ions, to form the body region 26.

Figure 6F:
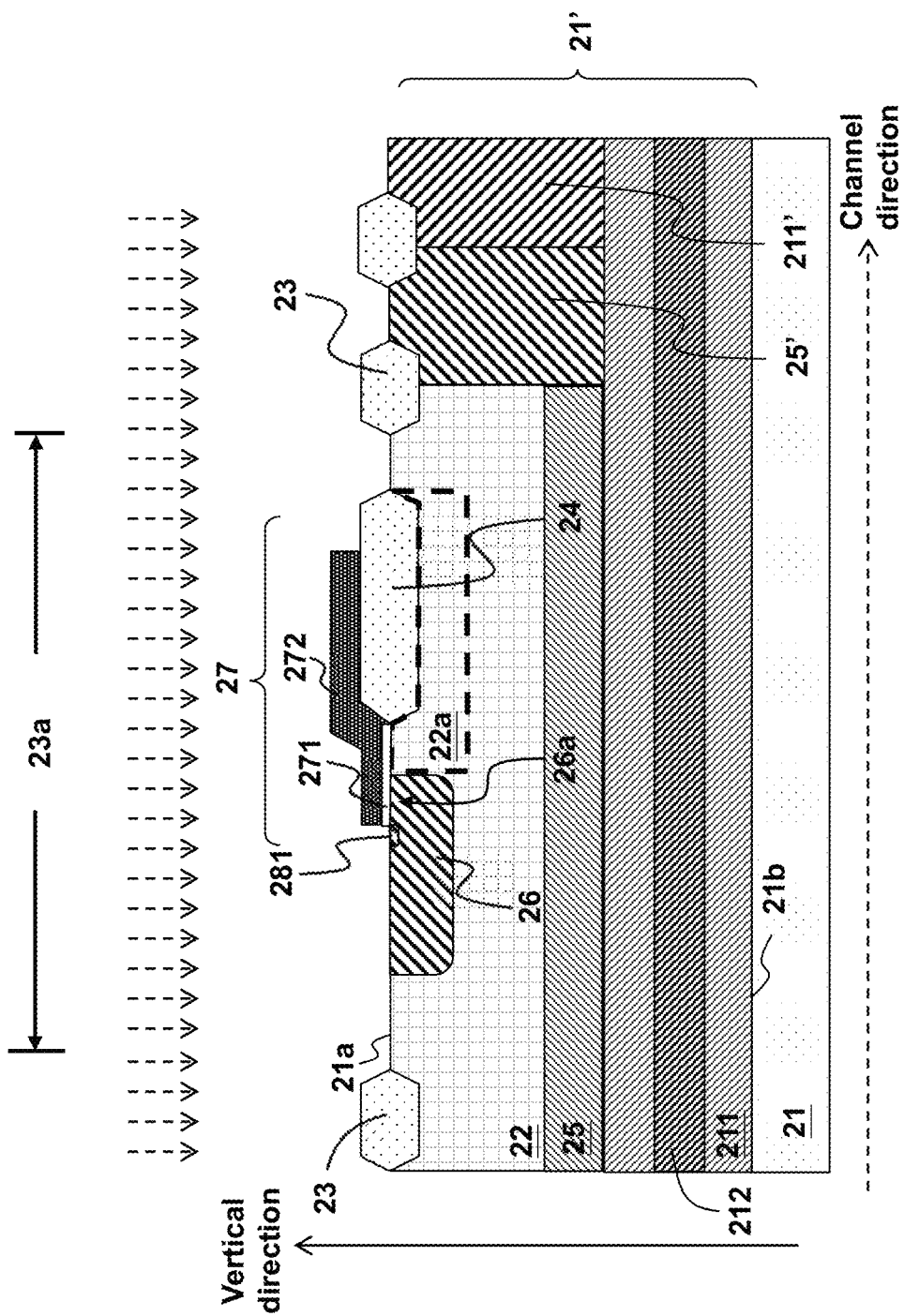

Next, referring to FIG. 6F, a dielectric layer 271 and a conductive layer 272 of the gate 27 is formed on the top surface 21a within the device region 23a, wherein part of the body region 26 is located below and in contact with the gate 27 in the vertical direction, to serve as the inversion current channel in the ON operation of the high voltage device 200.

Next, still referring to FIG. 6F, in one embodiment, a lightly doped region 281 is formed after the dielectric layer 271 and the conductive layer 272 of the gate 27 are formed, wherein the lightly doped region 281 is for forming a current flowing channel right below the spacer layer 273, to ensure that the inversion current channel can be formed in the ON operation of the device. The lightly doped region 281 can be formed by, by for example but not limited to, an ion implantation process step which implants second conductivity type impurities into the body region 26 in the form of accelerated ions as indicated by dashed arrows shown in FIG. 6F, to form the lightly doped region 281.

Figure 6G:
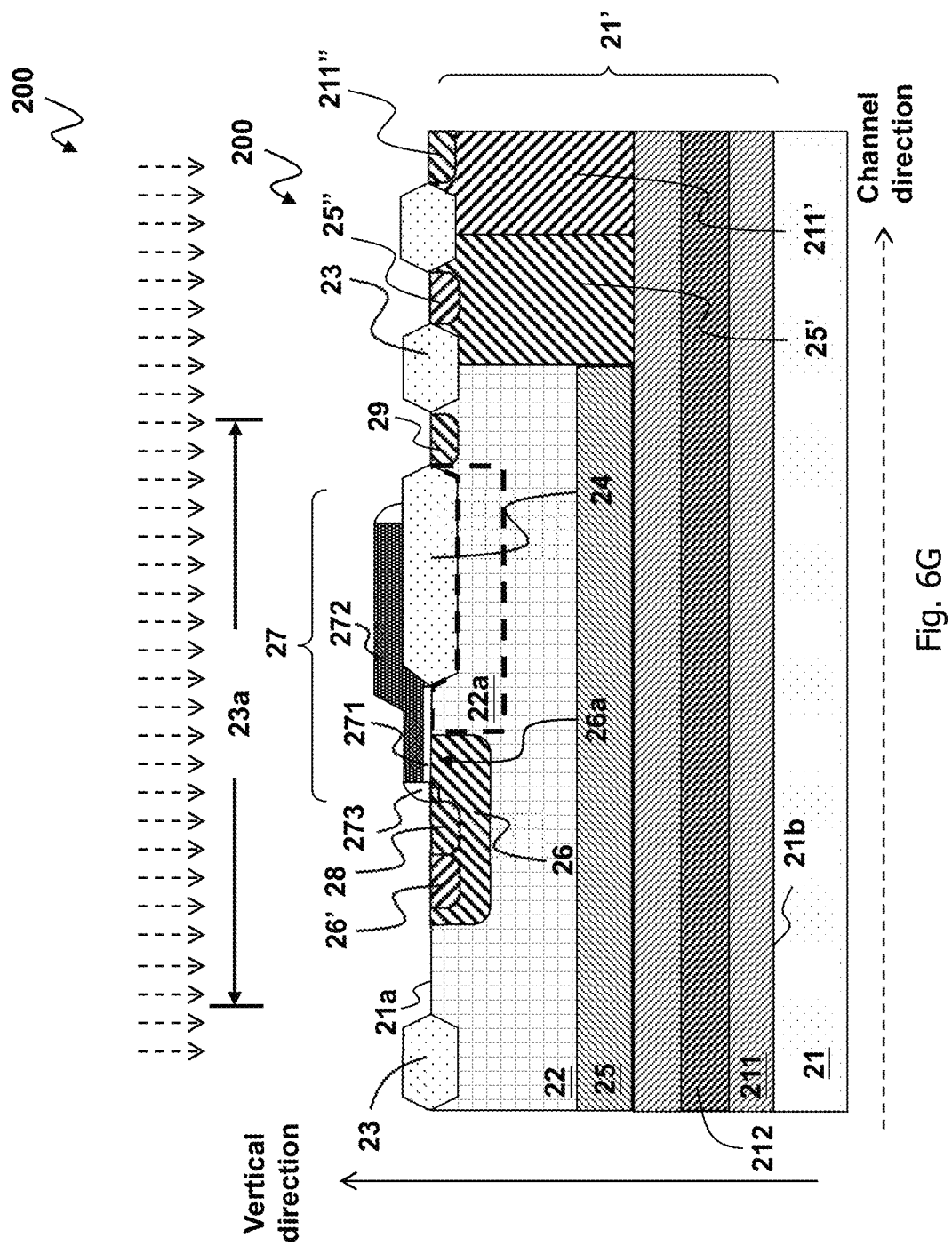

Next, referring to FIG. 6G, a spacer 273 is formed outside the sidewalls of the conductive layer 272. Next, a body contact 26', a source 28, a drain 29, a first conductivity type contact 25", and a second conductivity type contact 211" are formed below and in contact with the upper surface 21a in the device region 23a. The source 28 and the drain 29 have the second conductivity type. The source 28 and the drain 29 are located below and outside two sides of the gate 27 respectively, wherein the source 28 is located in the body region 26, and the drain 29 is located in the first high voltage well 22, at a location near the right side of the gate 27 (i.e., the side that is away from the body region 26). The drift region 22a is located in the first high voltage well 22 between the drain 29 and the body region 26 in the channel direction and in contact with the top surface 21a, to serve as the drift current channel in the ON operation of the high voltage device 200. The source 28 and the drain 29 are formed below the top surface 21a and in contact with the top surface 21a in the vertical direction. A second conductivity type contact 211" is formed in the second conductivity type well 211', and has the second conductivity type. The second conductivity type contact 211" is located below the top surface 21a and in contact with the top surface 21a in the vertical direction, to serve as an electrical contact of the second conductivity type well 211'. The second conductivity type contact 211", the source 28, and the drain 29 have the second conductivity type. The source 28 and the drain 29 can be formed by, by for example but not limited to, a lithography process step and an ion implantation process step, wherein the lithography process step includes forming a photo-resist layer as a mask, and the ion implantation process step implants second conductivity type impurities into the body region 26 and the drift well 22 in the form of accelerated ions, to form the source 28 and the drain 29.

A first conductivity type contact 25" having the first conductivity type is formed in the first well 25'; the first conductivity type contact 25" is located below the top surface 21a and in contact with the top surface 21a in the vertical direction, to serve as an electrical contact of the first well 25'. A body contact 26' having the first conductivity type is formed in the body region 26; the body contact 26' is located below and in contact with the top surface 21a in the vertical direction, wherein the body contact 26' serves as an electrical contact of the body region 26. The first conductivity type contact 25" and the body contact 26' can be formed by, for example but not limited to, a lithography process step and an ion implantation process step, wherein the lithography process step includes forming a photo-resist layer as a mask, and the ion implantation process step implants first conductivity type impurities in the first well 25' and the body region 26 in the form of accelerated ions, to form the first conductivity type contact 25" and the body contact 26'.

Figure 7A:
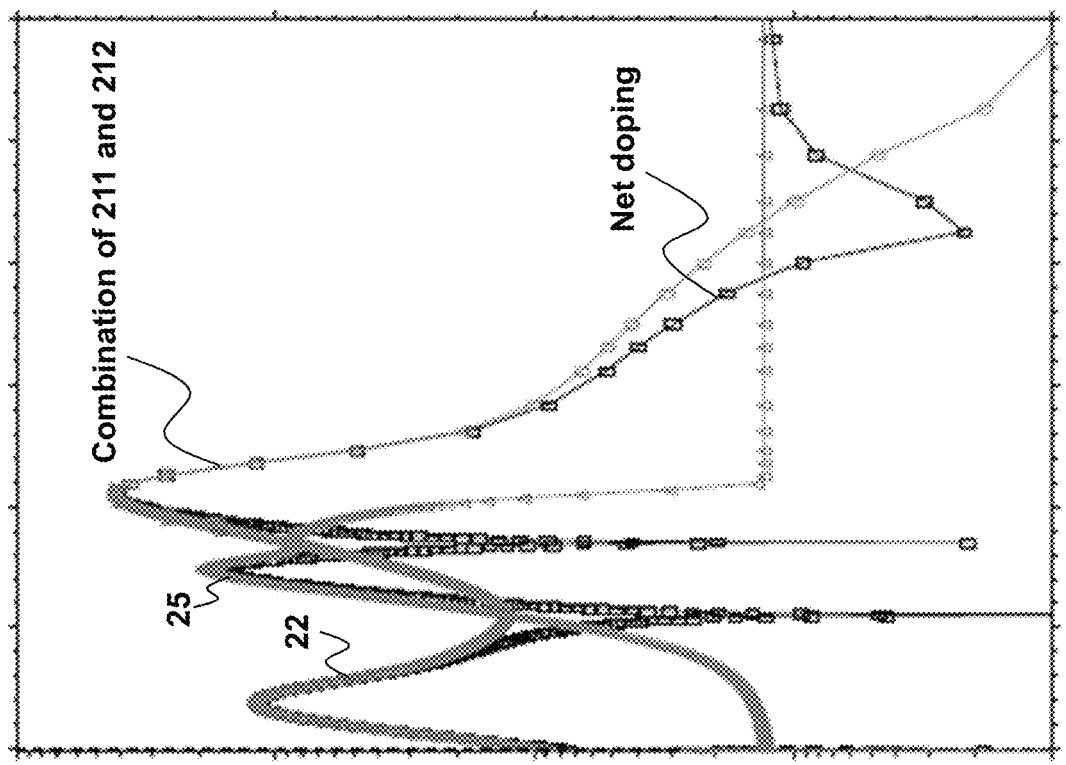
FIGS. 7A and 7B are schematic diagrams which show doping profiles of impurities between the body region 26 and the drain 29 of the high voltage device 200 without and with the high voltage well 212 respectively.
Figure 7B:
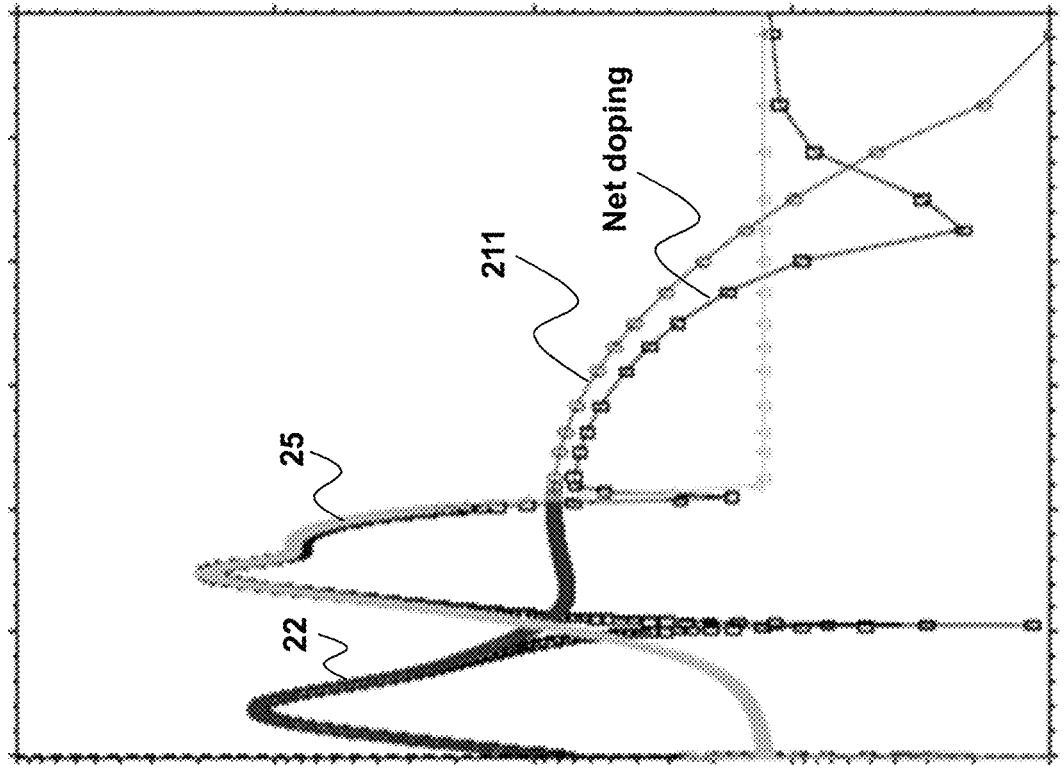

FIGS. 7A and 7B are schematic diagrams which show doping profiles of impurities between the body region 26 and the drain 29 in depth of the high voltage device 200 without and with the high voltage well 212 respectively. As shown in FIG. 7A, the impurities of the second deep well 211 is thermal diffused, so that the peak of the impurity concentration of the second conductivity type of the second deep well 211 is reduced to increase the breakdown voltage. The response time can be shorten and the operation speed can be improved of the high voltage device 200 by increasing the impurity concentration of the second conductivity type of second deep well 211; however, the arrangement of increasing the impurity concentration of the second conductivity type of the second deep well 211 will increase the current gain of the aforementioned parasitic transistor and then the high voltage device 200 and the adjacent device latch up. According to the present invention, as shown in FIG. 7B, a profile of combination of the impurity doping of the second deep well 211 and the high voltage well 212 shows that the high voltage well 212 is formed in the second deep well 211 without being processed as much thermal process as the second deep well 211, as thus, the operation speed of the high voltage device 200 can be improved and the latch-up of the parasitic transistor therein can be prevented. The thermal process after the high voltage well 212 is formed for example is same as the thermal process of a metal process step of the high voltage device 200, wherein the thermal process of the metal process step is well known by those skilled in the art, so it is not redundantly explained here.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. The various embodiments described above are not limited to being used alone; two embodiments may be used in combination, or a part of one embodiment may be used in another embodiment. For example, other process steps or structures, such as a threshold voltage adjustment region, may be added. For another example, the lithography process step is not limited to the mask technology but it can also include electron beam lithography, immersion lithography, etc. Therefore, in the same spirit of the present invention, those skilled in the art can think of various equivalent variations and various combinations, and there are many combinations thereof, and the description will not be repeated here. The scope of the present invention should include what are defined in the claims and the equivalents.

What is claimed is:
1. A high voltage device comprising:
a semiconductor layer, which is formed on a substrate, and has a top surface and a bottom surface opposite to the top surface in a vertical direction, wherein the substrate has a first conductivity type;
an isolation region, which is formed on and in contact with the top surface, wherein the isolation region is for defining a device region;
a first deep well having the first conductivity type, which is formed in the semiconductor layer;
a second deep well having a second conductivity type, which is formed below and in contact with the first deep well in the semiconductor layer, the second deep well encompassing a lower boundary of the first deep well;
a drift well having the second conductivity type, which is formed on and in contact with the first deep well in the semiconductor layer, and overlays an upper boundary of the first deep well, wherein the drift well is below and in contact with the top surface in the vertical direction;
a first well having the first conductivity type, which is formed on the second deep well outside the device region, and is located below the top surface and in contact with the top surface in the vertical direction, wherein the first well is in contact with the first deep well and electrically connected to the first deep well;
a second well having the second conductivity type, which is formed on the second deep well outside the device region and outside the first well, and is located below the top surface and in contact with the top surface in the vertical direction, wherein the second well is in contact with and electrically connected to the second deep well;
a body region having the first conductivity type, which is formed in the drift well within the device region, and is located below the top surface and in contact with the top surface in the vertical direction;
a body contact having the first conductivity type, which is formed in the body region, and is located below the top surface and in contact with the top surface in the vertical direction, wherein the body contact serves as an electrical contact of the body region;
a high voltage well having the second conductivity type, which is formed in the second deep well, wherein the high voltage well is not in contact with any of the first deep well, the first well, and the second well;
a gate, which is formed on the top surface within the device region, wherein part of the drift well is located below and in contact with the gate in the vertical direction, the gate including:
a dielectric layer, which is formed on and in contact with the top surface, and is in contact with the drift well in the vertical direction;
a conductive layer, which is formed on and in contact with the dielectric layer, and serves as an electrical contact of the gate; and
two spacer layers, which are formed outside of two sidewalls of the conductive layer, and serves as electrical insulation layers of the gate; and
a source and a drain having the second conductivity type, which are formed below and in contact with the top surface in the vertical direction within the device region, wherein the source and the drain are located below and outside two sides of the gate respectively, wherein the side of the gate which is closer to the source is a source side and the side of the gate which is closer to the drain is a drain side, and wherein the source is located in the body region, and the drain is located in the drift well outside the drain side;

wherein an inversion region is formed in the body region between the source and the drift well in a channel direction to serve as an inversion current channel in an on operation of the high voltage device;

wherein a drift region is located in the drift well between the drain and the body region in the channel direction, is in contact with the top surface, to serve as a drift current channel in the on operation of the high voltage device; and wherein at least part of the high voltage well is located vertically under all of the drift region.

2. The high voltage device of claim 1, further comprising a drift oxide region, which is formed on and in contact with the top surface, and is on and in contact with the drift region within the device region, wherein the drift oxide region includes a local oxidation of silicon (LOCOS) structure, a shallow trench isolation (STI) structure, or a chemical vapor deposition (CVD) oxide structure.

3. The high voltage device of claim 1, wherein a concentration of the second conductivity type impurities of the high voltage well is higher than a concentration of the second conductivity type impurities of the second deep well.

4. The high voltage device of claim 1, wherein the first deep well, the second deep well, and the substrate form a parasitic transistor, and the high voltage well suppresses a latch-up current generated by the parasitic transistor.

5. The high voltage device of claim 1, further comprising:
a first conductivity type contact having the first conductivity type, which is formed in the first well, below the top surface and in contact with the top surface in the vertical direction, to serve as an electrical contact of the first well; and
a second conductivity type contact having the second conductivity type, which is formed in the second well, below the top surface and in contact with the top surface in the vertical direction, to serve as an electrical contact of the second well.

6. A manufacturing method of a high voltage device, comprising:
forming a semiconductor layer on a substrate, the semiconductor layer having a top surface and a bottom surface opposite to the top surface in a vertical direction, wherein the substrate has a first conductivity type;
forming an isolation region on the top surface for defining a device region, wherein the isolation region is in contact with the top surface;
forming a first deep well having the first conductivity type in the semiconductor layer;
forming a second deep well having a second conductivity type below and in contact with the first deep well in the semiconductor layer, the second deep well encompassing a lower boundary of the first deep well;
forming a drift well having the second conductivity type on and in contact with the first deep well in the semiconductor layer, wherein the drift well overlays an upper boundary of the first deep well, and the draft well is below and in contact with the top surface in the vertical direction;
forming a first well having the first conductivity type on the second deep well outside the device region, wherein the first well is located below the top surface and in contact with the top surface in the vertical direction, and is in contact with the first deep well and electrically connected to the first deep well;
forming a second well having the second conductivity type on the second deep well outside the device region and outside the first well, wherein the second well is located below the top surface and in contact with the top surface in the vertical direction, and is in contact with and electrically connected to the second deep well;

forming a body region having the first conductivity type in the drift well within the device region, wherein the body region is located below the top surface and in contact with the top surface in the vertical direction;

forming a body contact having the first conductivity type in the body region, wherein the body contact is located below the top surface and in contact with the top surface in the vertical direction, and the body contact serves as an electrical contact of the body region;

forming a high voltage well having the second conductivity type in the second deep well, wherein the high voltage well is not in contact with any of the first deep well, the first well, and the second well;

forming a gate on the top surface within the device region, wherein part of the drift well is located right below and in contact with the gate in the vertical direction, the gate including:
a dielectric layer, which is formed on and in contact with the top surface, and is in contact with the drift well in the vertical direction;
a conductive layer, which is formed on and in contact with the dielectric layer, and serves as an electrical contact of the gate; and
two spacer layers, which are formed outside of two sidewalls of the conductive layer, and serves as electrical insulation layers of the gate; and forming a source and a drain having the second conductivity type below and in contact with the top surface in the vertical direction within the device region, wherein the source and the drain are located below and outside two sides of the gate respectively, wherein the side of the gate which is closer to the source is a source side and the side of the gate which is closer to the drain is a drain side, and wherein the source is located in the body region, and the drain is located in the drift well outside the drain side;

wherein an inversion region is formed in the body region between the source and the drift well in a channel direction to serve as an inversion current channel in an ON operation of the high voltage device;

wherein a drift region is located in the drift well between the drain and the body region in the channel direction, is in contact with the top surface, to serve as a drift current channel in the ON operation of the high voltage device; and wherein at least part of the high voltage well is located vertically under all of the drift region.

7. The manufacturing method of the high voltage device of claim 6, further comprising: forming a drift oxide region on the top surface and in contact with the top surface, wherein the drift oxide region is formed on and in contact with the drift region within the device region, and wherein the drift oxide region includes a local oxidation of silicon (LOCOS) structure, a shallow trench isolation (STI) structure, or a chemical vapor deposition (CVD) oxide structure.

8. The manufacturing method of the high voltage device of claim 6, wherein a concentration of the second conductivity type impurities of the high voltage well is higher than a concentration of the second conductivity type impurities of the second deep well.

9. The manufacturing method of the high voltage device of claim 6, wherein the first deep well, the second deep well, and the substrate form a parasitic transistor, and the high voltage well suppresses a latch-up current generated by the parasitic transistor.

10. The manufacturing method of the high voltage device of claim 6, further comprising:
   forming a first conductivity type contact having the first conductivity type in the first well, wherein the first conductivity type contact is located below the top surface and in contact with the top surface in the vertical direction, to serve as an electrical contact of the first well; and
   forming a second conductivity type contact having the second conductivity type in the second well, wherein the second conductivity type contact is located below the top surface and in contact with the top surface in the vertical direction, to serve as an electrical contact of the second well.

* * * * *